(12) United States Patent
Hosoe et al.

(10) Patent No.: US 8,728,627 B2
(45) Date of Patent: *May 20, 2014

(54) MANUFACTURING METHOD OF ALUMINUM STRUCTURAL BODY AND ALUMINUM STRUCTURAL BODY

(75) Inventors: Akihisa Hosoe, Osaka (JP); Koji Nitta, Osaka (JP); Kazuki Okuno, Itami (JP); Tomoyuki Awazu, Itami (JP); Shinji Inazawa, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/237,204

(22) Filed: Sep. 20, 2011

(65) Prior Publication Data

US 2012/0070683 A1 Mar. 22, 2012

Related U.S. Application Data

(63) Continuation of application No. PCT/JP2011/060722, filed on May 10, 2011.

(30) Foreign Application Priority Data

May 12, 2010 (JP) .................................. 2010-110141
May 12, 2010 (JP) .................................. 2010-110142
May 28, 2010 (JP) .................................. 2010-122366
Jun. 8, 2010 (JP) .................................. 2010-130607

(51) Int. Cl.
*B32B 5/18* (2006.01)
*B32B 15/01* (2006.01)
*B32B 15/20* (2006.01)

(52) U.S. Cl.
USPC ........................................ 428/613; 428/652

(58) Field of Classification Search
USPC ............................................................ 429/236
See application file for complete search history.

(56) References Cited

U.S. PATENT DOCUMENTS 3,171,820 A * 3/1965 Volz ................................. 521/61
3,258,318 A * 6/1966 Gruhl ............................ 428/606

(Continued)

FOREIGN PATENT DOCUMENTS

JP 60-253157 12/1985
JP S61-076686 A 4/1986

(Continued)

OTHER PUBLICATIONS

Schlesinger, Electrochemistry Encyclopedia, Department of Physics University of Windsor, Sep. 2002.*

(Continued)

*Primary Examiner* — Adam Krupicka
(74) *Attorney, Agent, or Firm* — Drinker Biddle & Reath LLP

(57) ABSTRACT

There is provided a manufacturing method of an aluminum structure, including a conductive treatment process of forming an electrically conductive layer on a surface of a resin molded body, the electrically conductive layer being made of one or more metals selected from the group consisting of gold, silver, platinum, rhodium, ruthenium, palladium, nickel, copper, cobalt, iron, and aluminum, and a plating process of plating the resin molded body subjected to the conductive treatment process with aluminum in a molten salt bath. The manufacturing method of an aluminum structure allows aluminum plating on the surface of even a porous resin molded body having a three-dimensional network structure. In particular, there is also provided a manufacturing method of an aluminum structure that can form porous aluminum having a large area.

1 Claim, 11 Drawing Sheets

(56) References Cited

U.S. PATENT DOCUMENTS

| | | | | |
|---|---|---|---|---|
| 3,351,442 A | * | 11/1967 | Hooper | 428/337 |
| 3,397,044 A | * | 8/1968 | Bylund | 428/583 |
| 4,076,888 A | * | 2/1978 | Perugini et al. | 428/613 |
| 4,978,431 A | * | 12/1990 | Brannan et al. | 205/137 |
| 2005/0069777 A1 | * | 3/2005 | Takami et al. | 429/245 |
| 2009/0178741 A1 | * | 7/2009 | Xun et al. | 149/15 |

FOREIGN PATENT DOCUMENTS

| | | |
|---|---|---|
| JP | 62-93058 | 4/1987 |
| JP | 63-089697 | 4/1988 |
| JP | 01-272790 | 10/1989 |
| JP | 02-073988 | 3/1990 |
| JP | 02-305988 | 12/1990 |
| JP | 04-002795 | 1/1992 |
| JP | 04-341594 | 11/1992 |
| JP | H05-214578 A | 8/1993 |
| JP | 5-271986 | 10/1993 |
| JP | 06-101088 | 4/1994 |
| JP | 06-122994 | 5/1994 |
| JP | 06-279609 | 10/1994 |
| JP | 6-306672 | 11/1994 |
| JP | 8-165590 | 6/1996 |
| JP | 8-170126 | 7/1996 |
| JP | 3202072 | 6/2001 |
| JP | 3413662 | 4/2003 |
| JP | 2004-509230 | 3/2004 |
| JP | 2005-187921 A | 7/2005 |
| JP | 2008-195990 | 8/2008 |
| JP | 2010-232171 | 10/2010 |
| WO | 02/22914 | 3/2002 |

OTHER PUBLICATIONS

Brothers et al., Mechanical properties of a density-graded replicated aluminum foam, Materials Science and Engineering A 489 (2008) pp. 4439-4443.*

* cited by examiner

MANUFACTURING METHOD OF ALUMINUM STRUCTURAL BODY AND ALUMINUM STRUCTURAL BODY

This application is a continuation of International Application No. PCT/JP2011/060722, which claims the benefit of priority from Japanese Patent Application No. 2010-122366, filed on May 28, 2010, Japanese Patent Application No. 2010-110141, filed on May 12, 2010, Japanese Patent Application No. 2010-130607, filed on June 8, and Japanese Patent Application No. 2010-110142, filed on May 12, each of which is hereby incorporated by reference in their entirety.

TECHNICAL FIELD

The present invention relates to a method for forming an aluminum structural body on a resin surface by aluminum plating and, more particularly, to an aluminum structural body that can be suitably used as a porous metal body in applications, such as various filters and battery electrodes, and a manufacturing method of the aluminum structural body.

BACKGROUND ART

Porous metal bodies having a three-dimensional network structure have been used in a wide range of applications, such as various filters, catalyst supports, and battery electrodes. For example, Celmet (manufactured by Sumitomo Electric Industries, Ltd., registered trademark) made of nickel has been used as an electrode material for batteries, such as nickel-hydrogen batteries and nickel-cadmium batteries. Celmet is a porous metal body having continuous pores and characteristically has a higher porosity (90% or more) than other porous bodies, such as metal non-woven fabrics. Celmet can be manufactured by forming a nickel layer on a surface of the skeleton of a porous resin having continuous pores, such as urethane foam, decomposing the resin expansion molded body by heat treatment, and reducing the nickel. The nickel layer can be formed by performing a electrical conduction treatment of applying a carbon powder to the surface of the skeleton of the resin expansion molded body and then depositing nickel by electrodeposition.

Aluminum has excellent characteristics, such as conductive property, corrosion resistance property, and lightweight. For use in batteries, for example, aluminum foil to which an active material, such as lithium cobalt oxide, is applied has been used as a positive electrode of lithium-ion batteries. In order to increase the capacity of a positive electrode, an aluminum body can be processed into a porous body having a large surface area, and the inside of the aluminum body can be filled with an active material. This allows the active material to be utilized even in an electrode having a large thickness and improves the active material availability ratio per unit area.

As a manufacturing method of porous aluminum, Patent Literature 1 describes a method for subjecting a plastic substrate having an inner continuous space and a three-dimensional network to an aluminum vapor deposition process by an arc ion plating method to form a metallic aluminum layer having a thickness in the range of 2 to 20 μm. Patent Literature 2 describes a method for forming a porous metal body, including forming a film made of a metal (such as copper) on the skeleton of a resin expansion molded body having a three-dimensional network structure, the metal having an ability to form an eutectic alloy at the melting point of aluminum or less, applying an aluminum paste to the film, and performing heat treatment in a non-oxidizing atmosphere at a temperature of 550° C. or more and 750° C. or less to evaporate the organic constituent (resin foam) and sinter the aluminum powder.

Since aluminum has high chemical affinity to oxygen and a lower electric potential than hydrogen, the electrodeposition in a plating bath containing an aqueous solution is difficult to perform in aluminum plating. Aluminum electrodeposition has been studied in a plating bath containing a non-aqueous solution, in particular, a plating bath containing an organic solvent. For example, as a technique for plating a metal surface with aluminum, Patent Literature 3 discloses an aluminum electrodeposition method characterized in that a low melting composition, which is a blend melt of an onium halide and an aluminum halogenide, is used in a plating bath, and aluminum is deposited on a cathode while the water content of the plating bath is maintained at 2% by weight or less.

CITATION LIST

Patent Literature

PTL 1: Japanese Patent No. 3413662
PTL 2: Japanese Unexamined Patent Application Publication No. 8-170126
PTL 3: Japanese Patent No. 3202072

SUMMARY OF INVENTION

Technical Problem

In accordance with the method described in Patent Literature 1, porous aluminum having a thickness in the range of 2 to 20 μm can be manufactured. However, it is difficult to produce a large area by the gas phase method and, depending on the thickness or porosity of a substrate, it is difficult to form a layer having a uniform interior. There are additional problems of a low rate of formation of the aluminum layer and high manufacturing costs because of expensive installation. In accordance with the method described in Patent Literature 2, unfortunately, a layer that forms an eutectic alloy with aluminum is formed instead of a high-purity aluminum layer. Although an aluminum electrodeposition method is known, plating of only a metal surface is possible, and there is no known method for electrodeposition on a resin surface, in particular, electrodeposition on the surface of a porous resin molded body having a three-dimensional network structure. This is probably influenced by the dissolution of a porous resin in a plating bath and other problems.

Accordingly, it is an object of the present invention to provide a method for forming an aluminum structural body that allows aluminum plating on a surface of a resin molded body, in particular, even on a surface of a porous resin molded body having a three-dimensional network structure, and a manufacturing method of porous aluminum having a large area particularly suitable for use in electrodes.

Solution to Problem

In order to solve the problems described above, the present inventors have arrived at a method for aluminum electrodeposition of a surface of a resin molded body made of polyurethane, melamine, or the like. The present invention provides a manufacturing method of an aluminum structural body, including: a electrical conduction treatment process of forming an electrically conductive layer on a surface of a resin molded body, the electrically conductive layer being made of one or more metals selected from the group consisting of gold, silver, platinum, rhodium, ruthenium, palladium, nickel, copper, cobalt, iron, and aluminum; and a plating process of plating the resin molded body subjected to the electrical conduction treatment process with aluminum in a molten salt bath (the first invention of the present application). As described above, although aluminum plating has been performed on metal surfaces, electrodeposition of resin molded body surfaces has not been considered. The present invention is characterized in that making a resin molded body surface be electrically conductive (electrical conduction treatment) makes it possible to perform aluminum plating in a molten salt bath and that a structure suitable as an electrically conductive layer was found.

As described above, although aluminum plating has been performed on metal surfaces, electrodeposition of resin molded body surfaces has not been considered. The present invention is characterized in that the electrical conduction treatment of a resin molded body surface with aluminum was found to make it possible to perform aluminum plating even in a molten salt bath.

Use of the metals described above in the electrically conductive layer has the following advantages over other means. The electrically conductive layer made of any of the metals described above has a high electrical conductivity as compared with electrical conduction treatment with another metal or carbon and is suitable as an electrically conductive layer. Furthermore, these metals tend to form a layer having a smooth surface. In addition, these metallic materials are resistant to oxidation and do not form an oxide layer that prevents the adhesion of aluminum plating. Thus, the plating process can be performed without requiring any particular treatment immediately before aluminum plating. Thus, these metals are suitable to form a uniform and large-area aluminum plated layer even on a resin molded body surface having a complicated shape. However, these materials are expensive. Thus, the thickness of the electrically conductive layer should be minimized to decrease the amount of metal used. Thus, the suitable thickness ranges from 0.001 to 0.2 µm, preferably 0.01 to 0.1 µm.

When used as an electrode material for batteries and the like, the metals described above have excellent distinctive advantages over other metals. When another metal is used in the electrically conductive layer and used as an electrode material for a battery, a large amount of residual metallic material other than aluminum may be dissolved from the electrode and deposited on the counter electrode in charge-discharge cycles, causing a short circuit. In contrast, the metals described above used as electrode materials do not undergo dissociation in the charge-discharge cycles of the battery and do not cause any problem.

Preferably, the electrical conduction treatment process is a process of depositing one or more metals selected from the group consisting of gold, silver, platinum, rhodium, ruthenium, palladium, and aluminum on the resin molded body surface by a gas phase method (the third invention of the present application). The gas phase method is suitable for the formation of a thin and smooth electrically conductive layer. The electrical conduction treatment process may be a process of depositing one or more metals selected from the group consisting of gold, silver, platinum, rhodium, ruthenium, palladium, nickel, copper, cobalt, and iron on the resin molded body surface by electroless plating (the fourth invention of the present application). Electroless plating is preferred in that it can form a substantially uniform electrically conductive layer even in a resin molded body having a complicated structure, such as a porous body having a fine three-dimensional network structure, at any portion of the entire molded body, including a surface layer or a deep portion. Alternatively, like electroless plating, a process of dipping the resin molded body in a coating material containing one or more metals selected from the group consisting of gold, silver, platinum, rhodium, ruthenium, palladium, and aluminum to deposit the metal(s) may preferably be used (the fifth invention of the present application).

A porous resin article having a three-dimensional network structure may be used to manufacture porous aluminum (the second invention of the present application). Preferably, a porous resin article made of urethane or melamine is preferably used because a porous resin article having high porosity can be manufactured, and porous aluminum suitable for use in electrodes can be manufactured (the sixth invention of the present application).

An aluminum strucutral body that includes a resin molded body having a metal layer on a surface thereof is manufactured through these processes. Depending on the application, such as a filter or a catalyst support, the aluminum structural body may be directly used as a resin-metal composite. In order to use a metal structure without resin because of constraints resulting from the usage environment, such as use in electrodes, the resin may be removed.

In accordance with a electrical conduction treatment process of forming an electrically conductive layer made of one or more metals selected from the group consisting of gold, silver, platinum, rhodium, ruthenium, palladium, nickel, copper, cobalt, and iron on a surface of a resin molded body, the resulting aluminum structural body have two metal layers: an electrically conductive layer containing the metal(s) and an aluminum layer. The two-layer structure can have various advantageous characteristics, such as higher mechanical strength, relative to structures made of aluminum alone and find different applications. For example, copper can characteristically impart high electrical conductivity, and nickel, cobalt, or iron can characteristically impart magnetic properties.

For use in electrodes, for example, for use in batteries, the relationship between an electrolyte and its working voltage inhibits the use of a certain type of metal, and in some cases the structure must essentially be made of aluminum alone. For such applications, the manufacturing method of an aluminum structural body preferably includes a dissolution process of dissolving the electrically conductive layer after the plating process (the eighth invention of the present application). In the dissolution of the electrically conductive layer, the electrically conductive layer can be removed without dissolving aluminum by dipping the electrically conductive layer in an acid, particularly a concentrated nitric acid solution, which is an oxidizing acid. Aluminum forms a passivation film on the surface thereof in an oxidizing acid and is not dissolved in the acid. On the other hand, a metal used in the electrically conductive layer is dissolved in the acid.

An additional process of removing the resin molded body before the dissolution process makes it possible to manufacture both an aluminum structural body including the resin molded body and an aluminum structural body without the resin molded body (the ninth invention of the present application). Since it is desirable that no resin remain for use in electrodes, the resin molded body is preferably removed.

The present inventors have arrived at a method for aluminum electrodeposition of a surface of a resin molded body made of polyurethane, melamine, or the like. The present invention provides a manufacturing method of an aluminum structural body, including a electrical conduction treatment process of forming an electrically conductive layer made of aluminum on a surface of a resin molded body, a process of performing a conversion treatment method for zinc or zinc alloy plating on a surface of the electrically conductive layer to form a zinc film, and a plating process of plating the resin molded body having the zinc film with aluminum in a molten salt bath. (The tenth invention of the present application).

As described above, although aluminum plating has been performed on metal surfaces, electrodeposition of resin molded body surfaces has not been considered. The present invention is characterized in that making a resin molded body surface be electrically conductive (electrical conduction treatment) was found to make it possible to perform aluminum plating in a molten salt bath.

Since aluminum can easily react with oxygen, a thin oxide film tends to be formed on a surface of an electrically conductive layer made of aluminum. The presence of an oxide film decreases the adhesion of plating, resulting in the formation of a defective aluminum plating film, such as island-shaped plating rather than a continuous film. Thus, the electrical conduction treatment process is followed by a conversion treatment method for zinc or zinc alloy plating (zincate treatment). In the method for zincate conversion plating, zinc is deposited while removing the aluminum oxide film. Thus, a zinc film is formed while the oxide film is broken. The conversion treatment method for zinc or zinc alloy plating is a displacement reaction between aluminum and zinc. The reaction is completed when the aluminum surface is covered with zinc, forming a ultrathin zinc film. The zinc film does not become thick, thus ensuring high aluminum purity. A stable oxide film is not formed on the zinc surface. Thus, an oxide layer that decreases the adhesion of aluminum plating is not formed. Hence, the subsequent plating process can be successfully performed.

In the process of the method for zincate conversion plating, the resin molded body having the electrically conductive layer is dipped in a liquid for a method for zincate conversion plating. The liquid for the conversion treatment method for zinc or zinc alloy plating is a strong alkali solution of zinc oxide. An alkaline component of the liquid dissolves the oxide film on the aluminum surface of the electrically conductive layer. In the case of a base material having a complicated shape, such as a porous resin article having a three-dimensional network structure, a portion where no oxide film is formed occurs as a minute defect on the surface of the electrically conductive layer (aluminum layer). Dipping such a resin molded body in a strong alkali liquid for the conversion treatment method for zinc or zinc alloy plating may cause excessive dissolution of aluminum in the portion having no oxide film on the surface thereof. Thus, the electrically conductive layer becomes brittle and peels off. The subsequent plating cannot therefore be successfully performed. Thus, in the process of the conversion treatment method for zinc or zinc alloy plating, the temperature of the liquid for the conversion treatment method for zinc or zinc alloy plating is lower than the general processing temperature, preferably 4° C. or more and 15° C. or less (the eleventh invention of the present application). When the temperature of the liquid for the conversion treatment method for zinc or zinc alloy plating is 15° C. or less, the reaction is tempered, thus preventing excessive dissolution of the aluminum surface. On the other hand, a processing temperature of less than 4° C. results in a low reaction rate and a long treatment time, thus increasing the manufacturing costs.

The present inventors have arrived at a method for aluminum electrodeposition of a surface of a resin molded body made of polyurethane, melamine, or the like. The present invention provides a manufacturing method of an aluminum structural body, including a electrical conduction treatment process of forming an electrically conductive layer made of aluminum on a surface of a resin molded body, a process of depositing one or more noble metals selected from the group consisting of gold, silver, platinum, rhodium, ruthenium, and palladium on a surface of the electrically conductive layer, and a plating process of plating the resin molded body, on which the noble metal(s) is deposited, with aluminum in a molten salt bath. (The twelfth invention of the present application)

As described above, although aluminum plating has been performed on metal surfaces, electrodeposition of resin molded body surfaces has not been considered. The present invention is characterized in that the electrical conduction treatment of a resin molded body surface with aluminum was found to make it possible to perform aluminum plating even in a molten salt bath.

Since aluminum can easily react with oxygen, a thin oxide film tends to be formed on a surface of an electrically conductive layer made of aluminum. The presence of an oxide film decreases the adhesion of plating, resulting in poor plating, such as island-shaped plating rather than a continuous film. Thus, after the electrical conduction treatment process, one or more noble metals selected from the group consisting of gold, silver, platinum, rhodium, ruthenium, and palladium may be deposited on a surface of the electrically conductive layer. The noble metal(s) may be deposited by a gas phase method, such as vapor deposition or sputtering. By the gas phase method, even if a thin oxide film is formed on a surface of the aluminum base, the noble metal(s) can be deposited on the aluminum without problems. The noble metal(s) may also be deposited by electroless plating or the application of a coating material containing the noble metal(s). These noble metals are resistant to oxidation and do not form an oxide layer that prevents the adhesion of aluminum plating. Thus, the subsequent aluminum plating in a molten salt can be successfully performed. Furthermore, the noble metals are rarely ionized. Thus, the noble metals rarely undergo dissociation from the electrode in the charge-discharge cycles of the battery, and the noble metals in an electrode material do not cause any problem.

An aluminum structural body manufactured by the method described above has the noble metal(s) on one surface in contact with the resin or one surface from which the resin is removed and aluminum on the other surface. As a whole, the aluminum structural body includes an aluminum layer having a thickness in the range of 1 to 100 μm as a metal layer, wherein the metal layer has an aluminum purity of 90.0% or more and contains 0.01% or more and 10% or less gold, silver, platinum, rhodium, ruthenium, and palladium in total and inevitable impurities as the balance (the fourteenth invention of the present application). The component ratio of the metals is measured with an inductively-coupled plasma emission spectrometer after the aluminum structural body has been dissolved in nitromuriatic acid.

An aluminum structural body manufactured by the method described above includes an aluminum layer having a thickness in the range of 1 to 100 μm as a metal layer, wherein the metal layer contains 80% by mass or more aluminum, 2% or more and 20% or less nickel, copper, cobalt, and iron in total, and inevitable impurities as the balance (the fifteenth invention of the present application).

An aluminum structural body manufactured by removing the electrically conductive layer in the method described above includes an aluminum layer having a thickness in the range of 1 to 100 μm as a metal layer, wherein the metal layer contains 98.0% by mass or more aluminum, 0.0001% by mass or more and less than 2% by mass nickel, copper, cobalt, and iron in total, and inevitable impurities as the balance (the sixteenth invention of the present application).

An aluminum structural body manufactured by the method described above includes an aluminum layer having a thickness in the range of 1 to 100 μm as a metal layer, wherein the entire metal layer except the resin has an aluminum purity of 98.0% or more and a zinc content of 0.0001% or more and 2% or less and contains inevitable impurities as the balance (the seventeenth invention of the present application).

An aluminum structural body manufactured by the method described above has aluminum on one surface in contact with the resin or one surface from which the resin is removed and on the other surface and includes a noble metal layer therein. More specifically, the aluminum structural body includes, as metal layers, a first aluminum layer having a thickness in the range of 1 to 100 μm on one surface, a second aluminum layer having a thickness in the range of 0.05 to 1 μm on the other surface, and a noble metal layer between the two aluminum layers (the eighteenth invention of the present application). The entire metal layer except the resin has an aluminum purity of 99.0% by mass or more and contains 0.001% by mass or more and 1.0% by mass or less gold, silver, platinum, rhodium, ruthenium, and palladium in total and inevitable impurities as the balance (the nineteenth invention of the present application).

When a porous resin having a three-dimensional network structure is used as the resin, the aluminum structural body thus manufactured includes an aluminum layer having a tubular skeleton structure and forming a porous body having generally contiguous pores (the twenty-first invention of the present application). In this case, the skeleton includes a tubular metal layer around the resin serving as the core or a cavity formed by the removal of the resin. The tubular metal layer has the noble metal(s) on the inner surface and aluminum on the outer surface. The components of the entire metal layer are described above.

An aluminum structural body can also be manufactured in which the skeleton structure has almost triangular sections, and the aluminum layer has a larger thickness at the vertexes of each of the triangular sections than at the middle of each side of the triangular sections (the twenty-second invention of the present application).

When a urethane foam or a melamine foam having a three-dimensional network structure is used as the porous resin molded body, the skeleton of the network structure generally has triangular sections. The term "triangular", as used herein, has no stringent definition and refers to a shape having approximately three vertexes and three curved lines as the sides. Thus, the shape of the aluminum structural body formed by plating also has an almost triangular skeleton. A process of depositing one or more noble metals selected from the group consisting of gold, silver, platinum, rhodium, ruthenium, and palladium by electroless plating will be described below as the electrical conduction treatment method. Such plating can form an electrically conductive layer having a relatively uniform thickness. The conductivity of the electrically conductive layer is substantially constant at all positions on each of the triangular sections. In aluminum plating under such conditions, electric field is concentrated at the corners (the vertexes of a triangular section), resulting in a greater thickness at the vertexes than at the middle of each side of the triangular section. Thus, the shape described above can be achieved. Such a shape can advantageously increase the strength of the tubular skeleton structure and improve the retention capacity of an active material in battery electrodes and other applications.

Advantageous Effects of Invention

The present invention can provide a method for plating a resin molded body surface, particularly a surface of a porous resin molded body having a three-dimensional network structure, with aluminum and manufacturing a substantially uniform thick film having a large area, particularly porous aluminum also suitable for use in electrodes.

DESCRIPTION OF EMBODIMENTS

Embodiments of the present invention will be described below with reference to a process of manufacturing porous aluminum as a representative example. Throughout the reference figures, like numerals designate like parts. The present invention is defined by the appended claims rather than by these embodiments. All modifications that fall within the scope of the claims and the equivalents thereof are intended to be embraced by the claims.

Figure 1:
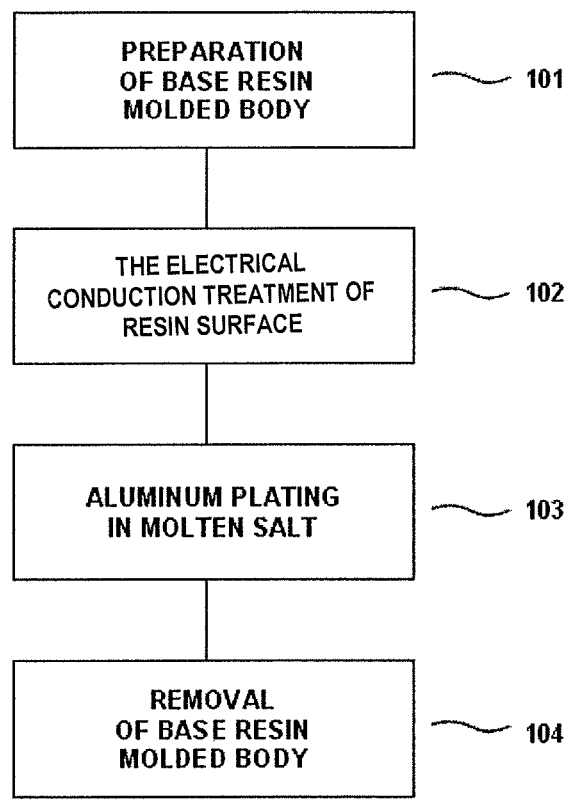
FIG. 1 is a flow chart of a process of manufacturing an aluminum structure structural body according to a first embodiment of the present invention.
Figure 2:
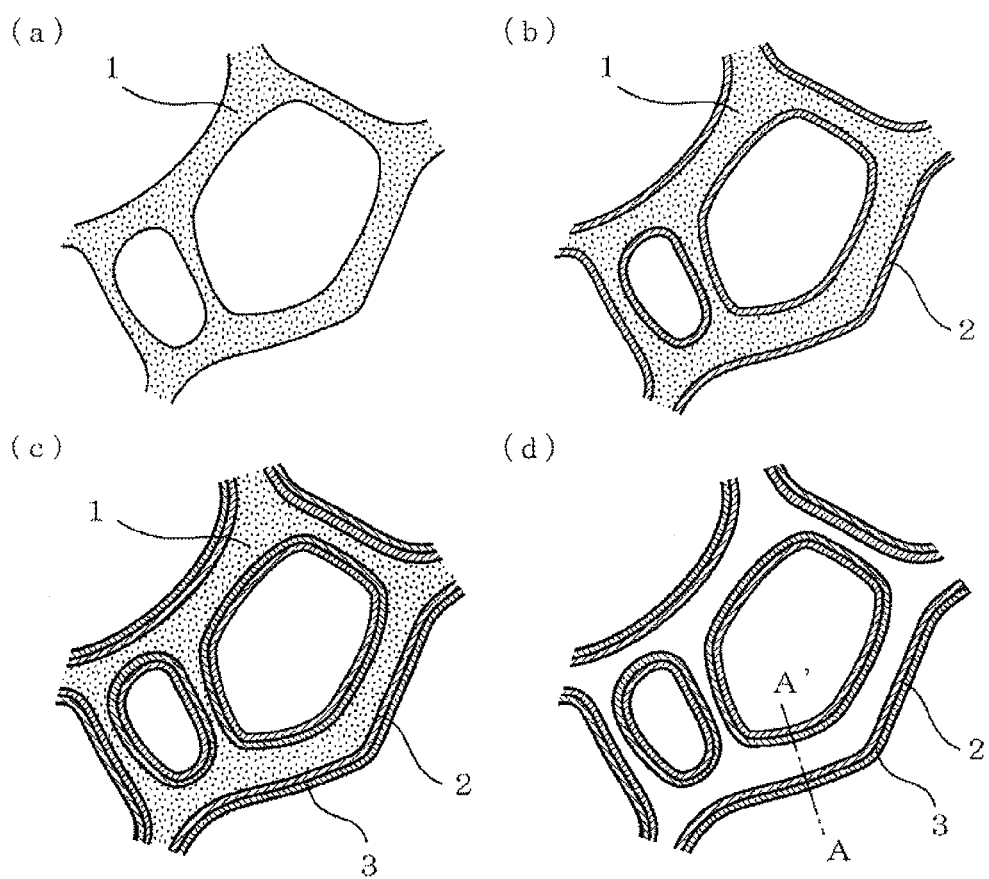
FIG. 2 is a schematic cross-sectional view illustrating the process of manufacturing an aluminum structure structural body according to the first embodiment of the present invention.

Process of Manufacturing Aluminum Structure Structural Body According to First Embodiment of Present Invention FIG. 1 is a flow chart of a process of manufacturing an aluminum structural body according to a first embodiment of the present invention. FIG. 2 shows schematic views of the formation of an aluminum structural body using a resin molded body as a core material in accordance with the flow chart. The general flow of the manufacturing process will be described below with reference to these figures. First, the preparation of a base resin molded body 101 is performed. FIG. 2(a) is an enlarged schematic view of a portion of a cross-section of a resin, which is the magnification of a surface of a resin expansion molded body having continuous pores serving as an example of a base material formed by a resin molded body. Pores are formed in the skeleton of a resin expansion molded body 1. The electrical conduction treatment of the surface of the resin molded body 102 is then performed. As illustrated in FIG. 2(b), through this process, a thin electrically conductive layer 2 is formed on the surface of the resin expansion molded body 1. Aluminum plating in a molten salt 103 is then performed to form an aluminum plated layer 3 on the surface of the electrically conductive layer of the resin molded body (FIG. 2(c)). Thus, an aluminum structural body is manufactured in which the aluminum plated layer 3 is formed on a surface of a base resin molded body serving as the base material. Removal of the base resin molded body 104 may be further performed. The resin expansion molded body 1 can be evaporated by decomposition to form an aluminum strucutral body (porous body) containing only the metal layer (FIG. 2(d)).

These processes will be described below process by process.

(Preparation of Porous Resin Molded Body)

A porous resin molded body having a three-dimensional network structure and continuous pores is prepared. The material of the porous resin molded body may be any resin. The material may be exemplified by a resin expansion molded body made of polyurethane, melamine, polypropylene, or polyethylene. The resin expansion molded body may be a resin molded body having any shape provided that the resin molded body has contiguous pores (continuous pores). For example, a nonwoven fabric containing tangled fibrous resin may be used in place of the resin expansion molded body. Preferably, the resin expansion molded body has a porosity in the range of 80% to 98% and a pore size in the range of 50 to 500 μm. Urethane foams and melamine foams have a high porosity, continuous pores, and an excellent pyrolysis property and are therefore suitable for the resin expansion molded body. Urethane foams are preferred in terms of the uniformity of pores and availability. Melamine foams are preferred because of their small pore size.

Figure 3:
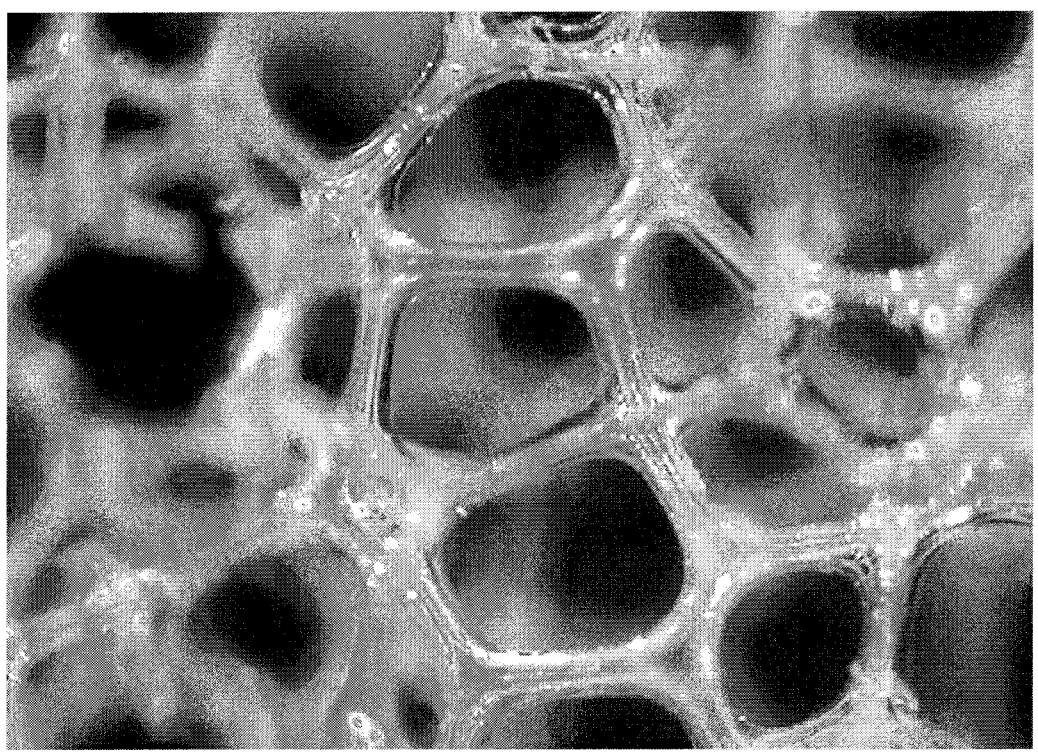
FIG. 3 is an enlarged photograph of a surface of the structure of a urethane foam as an example of a porous resin molded body.

Porous resin molded bodies often contain residue materials, such as a foaming agent and an unreacted monomer in the manufacture of the foam, and are therefore preferably subjected to washing treatment before the subsequent processes. As an example of the porous resin molded body, FIG. 3 illustrates a urethane foam subjected to a washing treatment as a preliminary treatment. The resin molded body has a three-dimensional network skeleton, which includes generally contiguous pores. The skeleton of the urethane foam has an almost triangular section perpendicular to the lateral direction. The porosity is defined by the following equation:

$$\text{Porosity}=(1-(\text{the weight of porous body [g]}/(\text{the volume of porous body [cm}^3\text{]}\times\text{material density})))\times 100[\%]$$

The pore size is determined by magnifying a surface of the resin molded body in a photomicrograph or the like, counting the number of pores per inch (25.4 mm) as the number of cells, and calculating the average pore size by the following equation: average pore size=25.4 mm/the number of cells. The porosity and the average pore size are determined in the same manner in the following embodiments.

(Electrical Conduction Treatment of Resin Molded Body Surface)

First, an electrically conductive layer made of one or more noble metals selected from the group consisting of gold, silver, platinum, rhodium, ruthenium, and palladium is formed on a surface of a resin expansion molded body. The electrically conductive layer may be formed by any method, for example, electroless plating, a gas phase method, such as sputtering or plasma chemical vapor deposition (CVD), or application of a coating material. A gas phase method, such as a vapor deposition method, is preferably applied to form a thin uniform film. The thickness of the electrically conductive layer ranges from 0.001 to 0.2 μm, preferably 0.01 to 0.1 μm. When the electrically conductive layer has a thickness of less than 0.001 μm, electrical conduction treatment is insufficient, and electrolytic plating cannot be properly performed in the next process. A thickness of more than 0.2 μm results in an increase in the cost of the electrical conduction treatment process. With a resin expansion molded body, when the thickness is large, electroless plating may be used to form a uniform layer from the surface to a deep portion.

In the following example, the vapor deposition of gold on a urethane surface will be described. Evaporation means is not particularly limited and may be a method for emitting an electron beam with an electron gun, resistance heating, induction heating, or a laser method. For uniform vapor deposition, an inert gas is preferably introduced around the urethane. The pressure of the introduced inert gas is 0.01 Pa or more. An inert gas pressure below 0.01 Pa results in poor deposition of the thin film, leaving an undeposited portion. The upper limit of the pressure of the inert gas atmosphere depends on the raw material heating method (such as an electron gun or resistance heating) and is preferably 1 Pa or less in terms of the amount of gas used and the deposition rate. Argon gas is suitably used as the inert gas. Argon gas is preferred because it is relatively abundant in the earth, is available at low cost, and has little adverse effects on the human body.

Vapor deposition of gold on urethane may be performed with an existing film-forming apparatus. For example, a vacuum evaporator that includes a film-forming chamber for partitioning a film formation target, a support and a heating container for mounting gold and the film formation target, respectively, and an electron gun for heating the gold can be suitably used. Use of the vacuum evaporator facilitates uniform introduction of an inert gas around urethane, which is a film formation target in the present invention, and facilitates the control of the inert gas pressure because a space around the urethane is partitioned. Thus, the use of the vacuum evaporator is preferred. First, urethane is mounted on the support in the vacuum evaporator, and gold is mounted on the heating container. The gold is a raw material of a thin film. Second, the film-forming chamber is evacuated to a high vacuum, and an inert gas is then introduced into the film-forming chamber. The pressure of the inert gas introduced into the film-forming chamber is adjusted in the range of 0.01 to 1 Pa. Finally, an electron beam is emitted from the electron gun to melt the gold, performing the deposition of a gold thin film on the urethane.

(Formation of Aluminum Layer: Molten Salt Plating)

The aluminum plated layer 3 is then formed on the surface of the resin molded body by electrolytic plating in a molten salt. A direct current is applied between a cathode of the resin molded body having a surface subjected to electrical conduction treatment and an anode of a 99.99% aluminum plate in a molten salt. The thickness of the aluminum plated layer ranges from 1 to 100 µm, preferably 5 to 20 µm. The molten salt may be an organic molten salt that is an eutectic salt of an organic halide and an aluminum halogenide or an inorganic molten salt that is an eutectic salt of an alkaline metal halide and an aluminum halogenide. Use of a bath of an organic molten salt that can melt at a relatively low temperature is preferred because it allows plating without the decomposition of the base material, a resin molded body. The organic halide may be an imidazolium salt or a pyridinium salt. Among others, 1-ethyl-3-methylimidazolium chloride (EMIC) and butylpyridinium chloride (BPC) are preferred. The imidazolium salt is preferably a salt that contains an imidazolium cation having alkyl groups at 1,3-position. In particular, aluminum chloride and 1-ethyl-3-methylimidazolium chloride ($AlCl_3$-EMIC) molten salts are most preferred because of their high stability and resistance to decomposition.

The contamination of a molten salt by water or oxygen causes a deterioration of the molten salt. Thus, plating is preferably performed in an atmosphere of an inert gas, such as nitrogen or argon, in a sealed environment. When an EMIC bath is used as the organic molten salt bath, the temperature of the plating bath ranges from 10° C. to 60° C., preferably 25° C. to 45° C.

Figure 5:
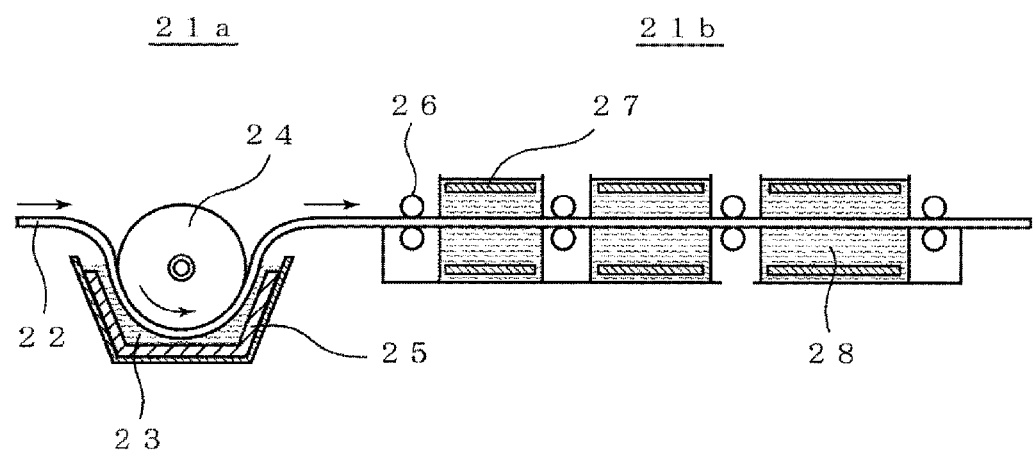
FIG. 5 is an explanatory view of a continuous aluminum plating process utilizing molten salt plating.

FIG. 5 is a schematic view of an apparatus for continuously performing a metal plating treatment of a strip of resin. A strip of resin 22 having a surface subjected to electrical conduction treatment is transferred from the left to the right in the figure. A plating bath 21a includes a cylindrical electrode 24, a positive electrode 25 disposed on the inner wall of a container, and a plating bath 23. The strip of resin 22 passes through the plating bath 23 along the cylindrical electrode 24. Thus, a uniform electric current can easily flow through the entire resin, achieving uniform plating. A plating bath 21b for performing thick uniform plating is composed of a plurality of baths so that plating can be performed multiple times. The strip of resin 22 having a thin metal layer on a surface thereof is transferred by electrode rollers 26, which function as feed rollers and power feeding cathodes on the outside of container, through a plating bath 28 to perform plating. The plurality of baths include positive electrodes 27 facing both faces of the resin via the plating liquid 28, allowing more uniform plating on both faces of the resin.

(Removal of Resin: Decomposition by Heating in Molten Salt)

An aluminum structural body (porous aluminum) having a resin molded body as the core of its skeleton is manufactured through these processes. Depending on the application, such as a filter or a catalyst support, the aluminum structural body may be directly used as a resin-metal composite. In order to use a metal structure without resin because of constraints resulting from the usage environment, the resin may be removed. The resin may be removed by decomposition (dissolution) with an organic solvent, a molten salt, or supercritical water, decomposition by heating, or any other method. Decomposition by heating at high temperature is convenient but causes the oxidation of aluminum. Unlike nickel, once oxidized, aluminum is difficult to reduce. Thus, for use in an electrode material for batteries, aluminum cannot be used because its conductive property is lost by oxidation. In order to prevent the oxidation of aluminum, therefore, a method for removing a resin by decomposition by heating in a molten salt as described below is preferably used.

Decomposition by heating in a molten salt is performed in the following manner. A resin expansion molded body having an aluminum plated layer on a surface thereof is dipped in a molten salt. The resin expansion molded body is decomposed by heating while a negative potential is applied to the aluminum layer. The application of the negative potential while dipping the resin expansion molded body in the molten salt can prevent the oxidation of aluminum. Heating under such conditions allows the decomposition of the resin expansion molded body without the oxidation of aluminum. The heating temperature can be appropriately determined in accordance with the type of the resin expansion molded body. The heating temperature must be lower than the melting point (660° C.) of aluminum so as not to melt aluminum. A preferred temperature range is 500° C. or more and 600° C. or less. A negative potential to be applied is on the minus side of the reduction potential of aluminum and on the plus side of the reduction potential of the cation in a molten salt.

The molten salt used in the decomposition of a resin by heating may be an alkaline metal or alkaline earth metal halide salt such that the aluminum electrode potential is less-noble. More specifically, a preferred molten salt contains one or more selected from the group consisting of lithium chloride (LiCl), potassium chloride (KCl), sodium chloride (NaCl), and aluminum chloride ($AlCl_3$). Removal of the resin by such a method can result in porous aluminum having a thin oxide layer on a surface thereof (a low oxygen content) and a low carbon content.

Figure 4:
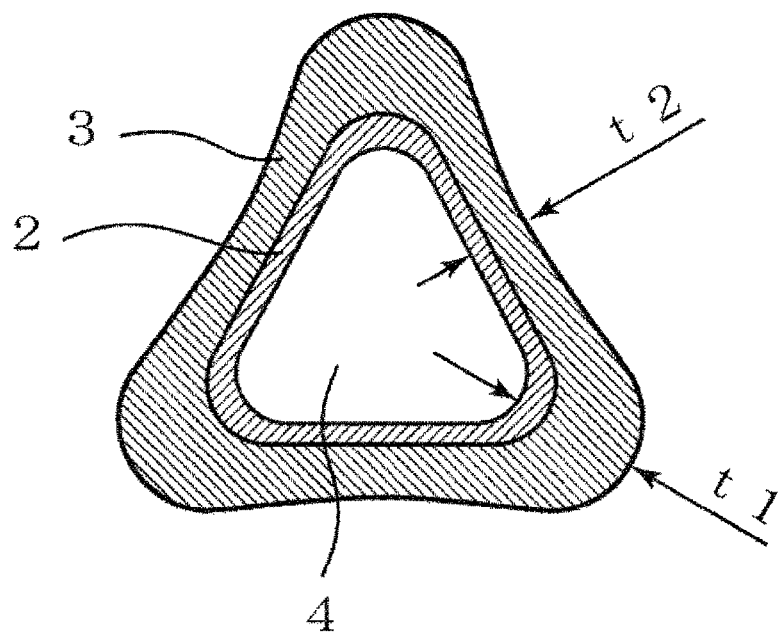
FIG. 4 is a schematic view of a cross-section of the skeleton of porous aluminum.

FIG. 4 is a schematic view of a cross-section taken along the line A-A' in FIG. 2(*d*). An aluminum layer composed of the electrically conductive layer 2 and the aluminum plated layer 3 has a tubular skeleton structure. A cavity 4 in the skeleton structure has almost triangular sections. The thickness ($t1$) including the electrically conductive layer of the aluminum layer at the vertexes of each of the triangular sections is greater than the thickness ($t2$) at the middle of each side of the triangular sections. This is probably because an electric field is concentrated at the corners (the vertexes of a triangular section) in the formation of the aluminum layer by plating. Thus, in an aluminum structural body manufactured by a method according to the present invention, the skeleton structure has almost triangular sections, and the aluminum layer has a larger thickness at the vertexes of each of the triangular sections than at the middle of each side of the triangular sections.

(Lithium-Ion Battery)

A battery electrode material and a battery each including porous aluminum will be described below. When porous aluminum is used in a positive electrode of a lithium-ion battery, the active material may be lithium cobalt oxide ($LiCoO_2$), lithium manganese oxide ($LiMn_2O_4$), or lithium nickel dioxide ($LiNiO_2$). The active material is used in combination with a conduction aid and a binder. In a known positive electrode material for lithium-ion batteries, an active material is applied to the surface of aluminum foil. In order to increase the battery capacity per unit area, the application thickness of the active material is increased. In order to effectively utilize the active material, the active material must be in electrical contact with the aluminum foil. Thus, the active material is mixed with a conduction aid. Porous aluminum according to the present invention has a high porosity and a large surface area per unit volume. Thus, even a thin layer of the active material on the surface of the porous aluminum can effectively utilize the active material, increasing the battery capacity and decreasing the amount of conduction aid to be mixed with.

Lithium-ion batteries include the positive electrode material described above as the positive electrode, graphite as the negative electrode, and an organic electrolyte as the electrolyte. Such lithium-ion batteries can have an increased capacity even with a small electrode area and accordingly have a higher energy density than conventional lithium-ion batteries. In a porous aluminum according to the present invention, in addition to aluminum, metallic materials forming the electrically conductive layer remain. These metals do not cause dissociation in the charge-discharge cycles of the battery and do not cause any problem.

(Molten Salt Battery)

The porous aluminum can also be used as an electrode material for molten salt batteries. When the porous aluminum is used as a positive electrode material, the active material is a metal compound, such as sodium chromite ($NaCrO_2$) or titanium disulfide ($TiS_2$), into which a cation of a molten salt serving as an electrolyte can be intercalated. The active material is used in combination with a conduction aid and a binder. The conduction aid may be acetylene black. The binder may be polytetrafluoroethylene (PTFE). For the active material of sodium chromate and the conduction aid of acetylene black, the binder is preferably PTFE because PTFE can tightly bind sodium chromate and acetylene black.

The porous aluminum can also be used as a negative electrode material for molten salt batteries. When the porous aluminum is used as a negative electrode material, the active material may be sodium alone, an alloy of sodium and another metal, or carbon. Sodium has a melting point of approximately 98° C. and becomes softer with an increase in temperature. Thus, it is preferable to alloy sodium with another metal (such as Si, Sn, or In). In particular, an alloy of sodium and Sn is preferred because of its excellent handleability. Sodium or a sodium alloy can be supported on the surface of the porous aluminum by electroplating, hot dipping, or another method. Alternatively, a metal (such as Si) to be alloyed with sodium may be deposited on the porous aluminum by plating and converted into a sodium alloy by charging the molten salt battery.

Figure 6:
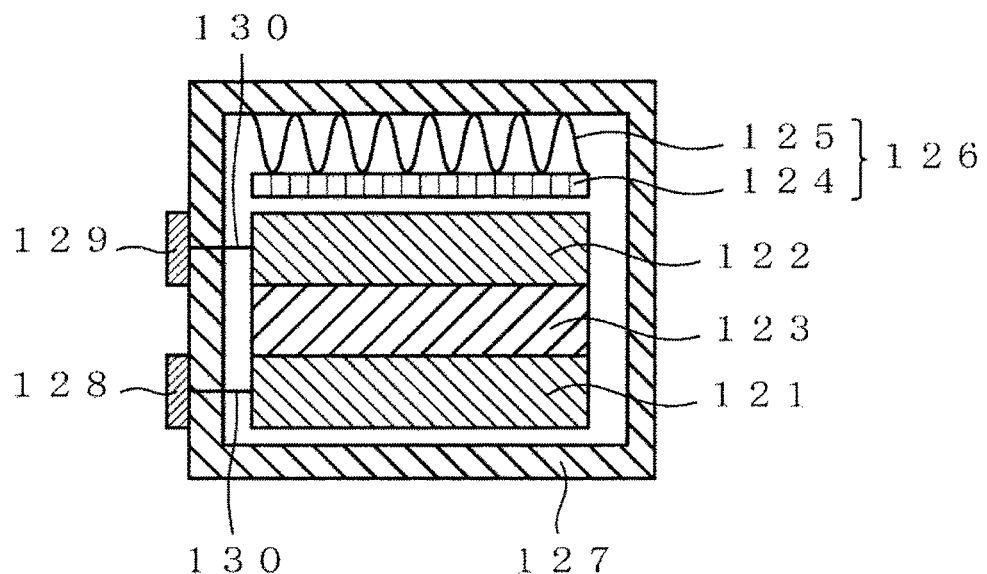
FIG. 6 is a schematic cross-sectional view of a structure in which porous aluminum is applied to a molten salt battery.

FIG. 6 is a schematic cross-sectional view of a molten salt battery manufactured by using the battery electrode material described above. The molten salt battery includes a positive electrode 121, in which a positive electrode active material is supported on the surface of the aluminum skeleton of porous aluminum, a negative electrode 122, in which a negative electrode active material is supported on the surface of the aluminum skeleton of porous aluminum, and a separator 123 impregnated with a molten salt electrolyte, in a case 127. A pressing member 126 is disposed between the top surface of the case 127 and the negative electrode. The pressing member 126 includes a presser plate 124 and a spring 125 for pressing the presser plate. The pressing member 126 can uniformly press the positive electrode 121, the negative electrode 122, and the separator 123 into contact with one another even when the volumes of them have changed. A collector (porous aluminum) of the positive electrode 121 and a collector (porous aluminum) of the negative electrode 122 are connected to a positive electrode terminal 128 and a negative electrode terminal 129, respectively, through a lead wire 130.

The molten salt serving as an electrolyte may be an inorganic salt or an organic salt that can melt at the operating temperature. The cation of the molten salt may be one or more selected from alkaline metals, such as lithium (Li), sodium (Na), potassium (K), rubidium (Rb), and cesium (Cs), and alkaline earth metals, such as beryllium (Be), magnesium (Mg), calcium (Ca), strontium (Sr), and barium (Ba).

In order to decrease the melting point of the molten salt, it is preferable to use a mixture of at least two salts. For example, use of potassium bis(fluorosulfonyl)amide (KFSA) and sodium bis(fluorosulfonyl)amide (NaFSA) in combination can decrease the battery operating temperature to 90° C. or less.

The molten salt is used in the form of a separator impregnated with the molten salt. The separator prevents the contact between the positive electrode and the negative electrode and may be a glass nonwoven fabric or porous resin. A laminate of the positive electrode, the negative electrode, and the separator impregnated with the molten salt housed in a case is used as a battery.

(Electrical Double Layer Capacitor)

The porous aluminum can also be used as an electrode material for electrical double layer capacitors. When the porous aluminum is used as an electrode material for an electrical double layer capacitor, the electrode active material may be activated carbon. The activated carbon is used in combination with a conduction aid or a binder. The conduction aid may be graphite or carbon nano-tube. The binder may be polytetrafluoroethylene (PTFE) or styrene-butadiene rubber.

Figure 7:
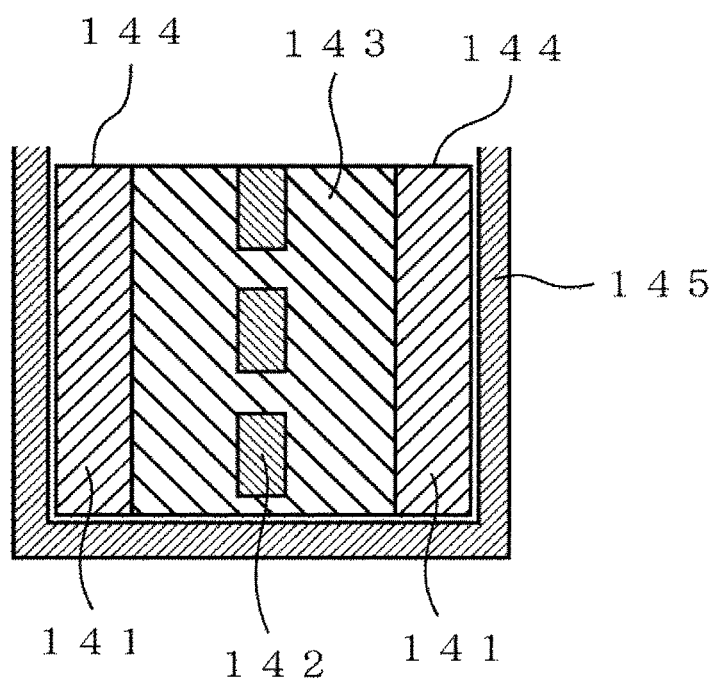
FIG. 7 is a schematic cross-sectional view of a structure in which porous aluminum is applied to an electrical double layer capacitor.

FIG. 7 is a schematic cross-sectional view of an electrical double layer capacitor manufactured by using the electrode material for an electrical double layer capacitor. A polarizable electrode 141 is disposed in an organic electrolyte 143 partitioned with a separator 142. The polarizable electrode 141 is made of an electrode material, which is an electrode active material supported on the porous aluminum. The electrode polarizable material 141 is connected to a lead wire 144. All the components are housed in a case 145. Use of the porous aluminum as a collector can increase the surface area of the collector. Thus, even a thin layer of activated carbon as the active material on the surface of the porous aluminum can result in an electrical double layer capacitor with a high power and a high capacity.

Although the resin expansion molded body is used as the resin molded body as described above, the present invention is not limited to the resin expansion molded body. A resin molded body having any shape can be used to manufacture an aluminum structural body having a desired shape.

EXAMPLE 1

An example of the manufacture of porous aluminum will be specifically described below. A urethane foam having a thickness of 1.6 mm, a porosity of 95%, and approximately 20 pores per centimeter was prepared as a resin expansion molded body and was cut into 140 mm×340 mm.

(Formation of Electrically Conductive Layer)

The vapor deposition of gold was performed on a surface of urethane foam by a vapor deposition method to form an electrically conductive layer having a thickness of 0.02 µm. Gold was evaporated by a method for emitting an electron beam with an electron gun. An inert gas was introduced around the urethane at a pressure in the range of 0.01 to 1 Pa. Gold was melted with an electron beam and was deposited as a gold thin film on the urethane.

(Molten Salt Plating)

The urethane foam having an electrically conductive layer on the surface thereof was mounted in a jig having an electricity supply function. The jig can supply electricity through four sides of the urethane foam and allows plating in a 100 mm×300 mm area. The urethane foam was placed in an argon atmosphere at low humidity (a dew-point temperature of −30° C. or less) in a glove box and was dipped in a molten salt aluminum plating bath (67% by mole $AlCl_3$-33% by mole EMIC) at a temperature of 40° C. The jig holding the urethane foam was connected to the cathode of a rectifier, and an aluminum plate (purity 99.99%) of the counter electrode was connected to the anode. The jig had electrodes on four sides so as to supply electricity through the corresponding four sides of the urethane foam. A direct current was applied at a current density of 3.6 $A/dm^2$ for 60 minutes to perform aluminum plating. Agitation was performed with a stirrer having a Teflon (registered trademark) rotor. The electric current density was calculated on the basis of the apparent area of the porous aluminum (the actual surface area of the urethane foam was approximately eight times the apparent area). As a result, 120 $g/m^2$ of an aluminum plating film was almost uniformly formed.

(Decomposition of Resin Expansion Molded Body)

The resin foam having the aluminum plated layer was dipped in a LiCl—KCl eutectic molten salt at a temperature of 500° C. A negative potential of −1 V was applied to the resin foam for 30 minutes. Air bubbles were generated in the molten salt, indicating the decomposition reaction of the polyurethane. The product was cooled to room temperature in the atmosphere and was washed with water to remove the molten salt, thus forming porous aluminum.

The porous aluminum was dissolved in nitromuriatic acid and was analyzed with an inductively-coupled plasma emission spectrometer. The aluminum purity had a purity of 91.5% by weight and contained 8% gold and 0.5% by weight carbon. The energy dispersive X-ray spectroscopy (EDX) of the surface at an accelerating voltage of 15 kV showed a negligible oxygen peak, indicating that the oxygen content of the porous aluminum was lower than the detection limit of EDX (3.1% by mass).

(Evaluation of Porous Aluminum in Battery)

The practical evaluation of porous aluminum used as a battery electrode will be described below in comparison with a conventional structure having an aluminum foil electrode.

A positive electrode active material $LiCoO_2$ having an average particle diameter of 7 μm, a conduction aid carbon black, and a binder resin polyvinylidene fluoride were mixed at 10:1:1 (mass ratio). A solvent N-methyl-2-pyrrolidone was added to the mixture to prepare a paste. Porous aluminum having a three-dimensional network structure and a porosity of approximately 95% was filled with the paste, was dried under vacuum at 150° C., and was role-pressed to a thickness corresponding to 70% of the initial thickness to form a battery electrode material (positive electrode). The battery electrode material was punched in a diameter of 10 mm and was fixed to a coin battery container made of stainless steel SUS304 by spot welding. The positive electrode capacity was 2.4 mAh.

For comparison purposes, the mixture paste of $LiCoO_2$, carbon black, and polyvinylidene fluoride was applied to aluminum foil having a thickness of 20 μm and was dried and role-pressed in the same manner as described above to prepare a battery electrode material (positive electrode). The battery electrode material was punched in a diameter of 10 mm and was fixed to a coin battery container made of stainless steel SUS304 by spot welding. The positive electrode capacity was 0.24 mAh.

A polypropylene porous film having a thickness of 25 μm was used as a separator. A solution of 1 M $LiPF_6$ in ethylene carbonate (EC)/diethyl carbonate (DEC) (volume ratio 1:1) was dropped at 0.1 $ml/cm^2$ on the separator, which was then subjected to vacuum impregnation. A lithium aluminum foil having a thickness of 20 μm and a diameter of 11 mm was fixed to the top lid of a coin battery container as a negative electrode. The battery electrode material (positive electrode), the separator, and the negative electrode were laminated in this order and were caulked with a Viton (registered trademark) o-ring placed between the top lid and the bottom lid to manufacture a battery. In charge and discharge, the upper limit voltage was 4.2 V, and the lower limit voltage was 3.0 V. Charging to the positive electrode capacity was followed by discharging at each discharge rate. The lithium secondary battery containing the porous aluminum as the positive electrode material had a capacity approximately five times the capacity of a conventional battery containing aluminum foil as the electrode material at 0.2 C. A problem of a short circuit was not observed also in the life test of the lithium-ion battery. A life-cycle test was performed on the basis of the cycle life described in Japan Industrial Standard C 8711. In charge and discharge, the upper limit voltage was 4.2 V, and the lower limit voltage was 3.0 V. A cycle of charging to the positive electrode filling capacity and discharging at a discharge rate of 0.2 C was performed multiple times. The lithium secondary battery that included the porous aluminum as the positive electrode material exhibited no reduction in voltage or capacity and did not cause a problem in the cycling characteristics as compared with the battery containing aluminum foil as the electrode material.

Figure 8:
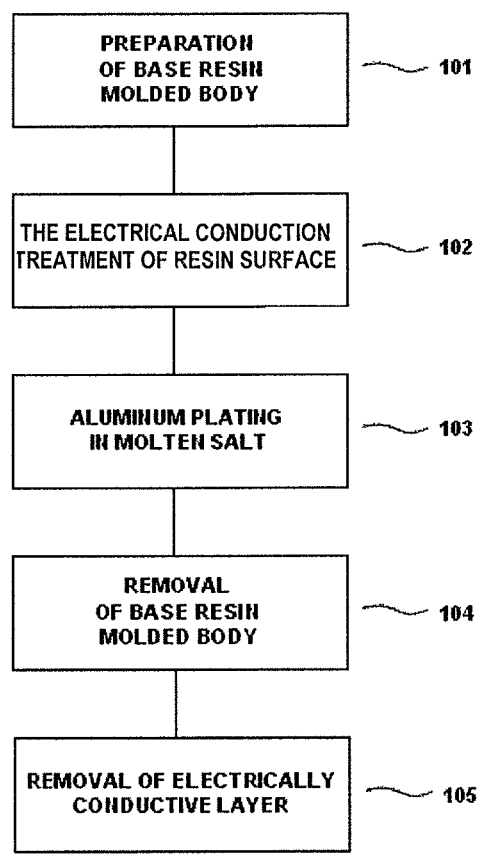
FIG. 8 is a flow chart of a process of manufacturing an aluminum structure structural body according to a second embodiment of the present invention.

Process of Manufacturing Aluminum Structure Structural Body According to Second Embodiment of Present Invention FIG. 8 is a flow chart of a process of manufacturing an aluminum structural body according to a second embodiment of the present invention. As illustrated in FIG. 2, an aluminum structural body is manufactured in the same manner as in the first embodiment of the present invention, in which an aluminum plated layer 3 is formed on a surface of a base resin molded body serving as the base material. Removal of the base resin molded body 104 may be further performed. Depending on the application, the removal of an electrically conductive layer 105 may be performed. The resin expansion molded body 1 can be evaporated by decomposition to form an aluminum structural body (porous body) containing only the metal layer.

These processes will be described below process by process.

(Preparation of Porous Resin Molded Body)

A porous resin molded body having a three-dimensional network structure and continuous pores is prepared in the same manner as in the first embodiment of the present invention. The material of the porous resin molded body may be any resin. The material may be exemplified by a resin expansion molded body made of polyurethane, melamine, polypropylene, or polyethylene.

(Electrical Conduction Treatment of Resin Molded Body Surface)

First, an electrically conductive layer made of one or more metals selected from the group consisting of nickel, copper, cobalt, and iron is formed on a surface of a resin expansion molded body. The electrically conductive layer may be formed by any method, for example, electroless plating, a gas phase method, such as vapor deposition, sputtering or plasma chemical vapor deposition (CVD), or application of a coating material. A gas phase method, such as a vapor deposition method, is also preferably applied to form a thin film. With a resin expansion molded body, when the thickness is large, electroless plating is preferably used to form a uniform layer from the surface to a deep portion. Preferably, the electrically conductive layer has a thickness in the range of 0.01 to 1 μM, preferably 0.1 to 0.5 μm. When the electrically conductive layer has a thickness of less than 0.01 μm, electrical conduction treatment is insufficient, and electrolytic plating cannot be properly performed in the next process. A thickness of more than 1 μm results in an increase in the cost of the electrical conduction treatment process.

A method of electroless plating is not particularly limited. For example, nickel plating on urethane foam will be described below. First, a colloid catalyst composed of palladium chloride and tin chloride is adsorbed on a urethane surface. Second, Sn is removed with sulfuric acid to activate the catalyst. The urethane foam is then dipped in a nickel plating solution containing hypophosphorous acid as a reducing agent to perform nickel electroless plating. In this case, use of hypophosphorous acid as a reducing agent inevitably forms a eutectoid with phosphorus, thus forming a phosphorus alloy.

(Formation of Aluminum Layer: Molten Salt Plating)

The aluminum plated layer 3 is then formed on the surface of the resin molded body by electrolytic plating in a molten salt. A direct current is applied between a cathode of the resin molded body having a surface subjected to electrical conduction treatment and an anode of a 99.99% aluminum plate in a molten salt. The aluminum plated layer has a thickness in the range of 1 to 100 μm, preferably 5 to 20 μM. The molten salt may be an organic molten salt that is an eutectic salt of an organic halide and an aluminum halogenide or an inorganic molten salt that is an eutectic salt of an alkaline metal halide and an aluminum halogenide. Use of a bath of an organic molten salt that can melt at a relatively low temperature is preferred because it allows plating without the decomposition of the base material, a resin molded body. The organic halide may be an imidazolium salt or a pyridinium salt. Among others, 1-ethyl-3-methylimidazolium chloride (EMIC) and butylpyridinium chloride (BPC) are preferred. The imidazolium salt is preferably a salt that contains an imidazolium cation having alkyl groups at 1,3-position. In particular, aluminum chloride and 1-ethyl-3-methylimidazolium chloride ($AlCl_3$-EMIC) molten salts are most preferred because of their high stability and resistance to decomposition.

The contamination of a molten salt by water or oxygen causes a deterioration of the molten salt. Thus, plating is preferably performed in an atmosphere of an inert gas, such as nitrogen or argon, in a sealed environment. When an EMIC bath is used as the organic molten salt bath, the temperature of the plating bath ranges from 10° C. to 60° C., preferably 25° C. to 45° C.

In the case that an electroplating bath which comprises an imidazolium salt is used as the molten salt bath, an organic solvent is preferably added to the molten salt bath. The organic solvent is particularly preferably xylene. The addition of an organic solvent, particularly xylene, has a distinctive effect on the formation of porous aluminum. More specifically, the skeleton structure of aluminum forming the porous body is tough (a first characteristic), and uniform plating can be achieved with a small difference in plating thickness between the surface and the interior of the porous body (a second characteristic). The first characteristic results from the fact that the addition of an organic solvent can change the plating state on the surface of the skeleton from granular (a granular appearance in surface observation because of great irregularities) to flat, thereby strengthening a thin and narrow skeleton. The second characteristic results from the fact that the addition of an organic solvent to the molten salt bath decreases the viscosity of the molten salt bath and accordingly facilitates the flow of the plating liquid into the fine network structure. At a high viscosity, a fresh plating liquid is easily fed to the porous body surface but is rarely fed into the interior. A decrease in viscosity facilitates the feeding of the plating liquid into the interior, allowing plating in a uniform thickness.

In the pressing of manufactured porous aluminum, these two characteristics of toughness and the uniform plating thickness in the interior and exterior can provide a porous body that generally has a tough skeleton and is uniformly pressed. When porous aluminum is used as an electrode material for batteries, an electrode filled with an electrode active material is pressed to increase its density, and the skeleton is often broken in the filling process of the active material or pressing. Thus, the two characteristics are very important in such an application.

In order to achieve these characteristics, the amount of organic solvent added to the plating liquid preferably ranges from 25% to 57% by mole. At 25% by mole or less, it is difficult to achieve an effect of decreasing a difference in thickness between the surface layer and the interior. At 57% by mole or more, the plating liquid becomes unstable, and the plating liquid and xylene are partially separated.

The plating process in a molten salt bath to which the organic solvent is added is preferably followed by a washing process using the organic solvent as a cleaning liquid. A plated resin surface requires washing to rinse off a plating liquid. Such washing after plating usually employs water. Although it is essential to avoid water in an electroplating bath which comprises an imidazolium salt, washing with water can bring water in the form of water vapor into the plating liquid. In order to prevent the adverse effects on plating, therefore, water washing should be avoided. Thus, washing with an organic solvent is effective. In the case that an organic solvent is added to the plating liquid as described above, washing with the organic solvent has an additional advantageous effect. The recovery and reuse of the plating liquid rinsed off can be relatively easy and inexpensive. For example, consider a case where a plated body wet with a bath in which xylene is added to a molten salt $AlCl_3$-EMIC is washed with xylene. The liquid rinsed off contains more xylene than the plating liquid used. The molten salt $AlCl_3$-EMIC is miscible with xylene in a limited ratio. Thus, the liquid rinsed off separates into xylene in the upper phase and the molten salt $AlCl_3$-EMIC containing approximately 57% by mole xylene in the lower phase. The lower phase can be recovered as molten salt. Since xylene has a boiling point as low as 144° C., the concentration of xylene in the recovered molten salt can be adjusted by heating to the concentration in the plating liquid. Thus, the recovered molten salt can be reused. After washing with an organic solvent, water washing at a location away from the plating bath is also preferably performed.

FIG. 5 is a schematic view of an apparatus for continuously performing a metal plating treatment of a strip of resin. A strip of resin 22 having a surface subjected to electrical conduction treatment is transferred from the left to the right in the figure. A plating bath 21*a* includes a cylindrical electrode 24, a positive electrode 25 disposed on the inner wall of a container, and a plating bath 23. The strip of resin 22 passes through the plating bath 23 along the cylindrical electrode 24. Thus, a uniform electric current can easily flow through the entire resin, achieving uniform plating. A plating bath 21*b* for performing thick uniform plating is composed of a plurality of baths so that plating can be performed multiple times. The strip of resin 22 having a thin metal layer on a surface thereof is transferred by electrode rollers 26, which function as feed rollers and power feeding cathodes on the outside of container, through a plating bath 28 to perform plating. The plurality of baths include positive electrodes 27 facing both faces of the resin via the plating bath 28, allowing more uniform plating on both faces of the resin.

(Removal of Resin: Decomposition by Heating in Molten Salt)

An aluminum structural body (porous aluminum) having a resin molded body as the core of its skeleton is manufactured through these processes. Depending on the application, such as a filter or a catalyst support, the aluminum structural body may be directly used as a resin-metal composite. In order to use a metal structure without resin because of constraints resulting from the usage environment, the resin may be removed. The resin may be removed by decomposition (dissolution) with an organic solvent, a molten salt, or supercritical water, decomposition by heating, or any other method. Decomposition by heating at high temperature is convenient but causes the oxidation of aluminum. Unlike nickel, once oxidized, aluminum is difficult to reduce. Thus, for use in an electrode material for batteries, aluminum cannot be used because its conductive property is lost by oxidation. In order to prevent the oxidation of aluminum, therefore, a method for removing a resin by decomposition by heating in a molten salt as described below is preferably used.

Decomposition by heating in a molten salt is performed in the following manner. A resin expansion molded body having an aluminum plated layer on a surface thereof is dipped in a molten salt. The resin expansion molded body is decomposed by heating while a negative potential is applied to the aluminum layer. The application of the negative potential while dipping the resin expansion molded body in the molten salt can prevent the oxidation of aluminum. Heating under such conditions allows the decomposition of the resin expansion molded body without the oxidation of aluminum. The heating temperature can be appropriately determined in accordance with the type of the resin expansion molded body. The heating temperature must be lower than the melting point (660° C.) of aluminum so as not to melt aluminum. A preferred temperature range is 500° C. or more and 600° C. or less. A negative potential to be applied is on the minus side of the reduction potential of aluminum and on the plus side of the reduction potential of the cation in a molten salt.

The molten salt used in the decomposition of a resin by heating may be an alkaline metal or alkaline earth metal halide salt such that the aluminum electrode potential is less-noble. More specifically, a preferred molten salt contains one or more selected from the group consisting of lithium chloride (LiCl), potassium chloride (KCl), sodium chloride (NaCl), and aluminum chloride ($AlCl_3$). Removal of the resin by such a method can result in porous aluminum having a thin oxide layer on a surface thereof (a low oxygen content) and a low carbon content.

FIG. 4 is a schematic view of a cross-section taken along the line A-A' in FIG. 2(*d*). An aluminum layer composed of the electrically conductive layer 2 and the aluminum plated layer 3 has a tubular skeleton structure. A cavity 4 in the skeleton structure has almost triangular sections. The thickness (t1) of the aluminum layer at the vertexes of each of the triangular sections is greater than the thickness (t2) of the aluminum layer at the middle of each side of the triangular sections. This is probably because an electric field is concentrated at the corners (the vertexes of a triangular section) in the formation of the aluminum layer by plating. Thus, in an aluminum structural body manufactured by a method according to the present invention, the skeleton structure has almost triangular sections, and the aluminum layer has a larger thickness at the vertexes of each of the triangular sections than at the middle of each side of the triangular sections.

(Removal of Electrically Conductive Layer)

In the dissolution of the electrically conductive layer, the electrically conductive layer is removed without dissolving aluminum by dipping the electrically conductive layer in an acid, particularly a concentrated nitric acid solution, which is an oxidizing acid. Aluminum forms a passivation film on the surface thereof in an oxidizing acid and is not dissolved in the acid. On the other hand, a metal used in the electrically conductive layer is dissolved in the acid. For example, an electrically conductive layer made of nickel may be dipped in a 67.5% concentrated nitric acid solution at a temperature in the range of 15° C. to 35° C. for 1 to 30 minutes, washed with water, and dried. For an electrically conductive layer made of another metal, an acid that can dissolve the metal may be used.

(Lithium-Ion Battery)

A battery electrode material and a battery each including porous aluminum will be described below. When porous aluminum is used in a positive electrode of a lithium-ion battery, the active material may be lithium cobalt oxide ($LiCoO_2$), lithium manganese oxide ($LiMn_2O_4$), or lithium nickel dioxide ($LiNiO_2$). The active material is used in combination with a conduction aid and a binder. In a known positive electrode material for lithium-ion batteries, an active material is applied to the surface of aluminum foil. In order to increase the battery capacity per unit area, the application thickness of the active material is increased. In order to effectively utilize the active material, the active material must be in electrical contact with the aluminum foil. Thus, the active material is mixed with a conduction aid. Porous aluminum according to the present invention has a high porosity and a large surface area per unit volume. Thus, even a thin layer of the active material on the surface of the porous aluminum can effectively utilize the active material, increasing the battery capacity and decreasing the amount of conduction aid to be mixed with. Lithium-ion batteries include the positive electrode material described above as the positive electrode, graphite as the negative electrode, and an organic electrolyte as the electrolyte. Such lithium-ion batteries can have an increased capacity even with a small electrode area and accordingly have a higher energy density than conventional lithium-ion batteries.

(Molten Salt Battery)

The porous aluminum can also be used as an electrode material for molten salt batteries. When the porous aluminum is used as a positive electrode material, the active material is a metal compound, such as sodium chromite ($NaCrO_2$) or titanium disulfide ($TiS_2$), into which a cation of a molten salt serving as an electrolyte can be intercalated. The active material is used in combination with a conduction aid and a binder. The conduction aid may be acetylene black. The binder may be polytetrafluoroethylene (PTFE). For the active material of sodium chromate and the conduction aid of acetylene black, the binder is preferably PTFE because PTFE can tightly bind sodium chromate and acetylene black.

The porous aluminum can also be used as a negative electrode material for molten salt batteries. When the porous aluminum is used as a negative electrode material, the active material may be sodium alone, an alloy of sodium and another metal, or carbon. Sodium has a melting point of approximately 98° C. and becomes softer with an increase in temperature. Thus, it is preferable to alloy sodium with another metal (such as Si, Sn, or In). In particular, an alloy of sodium and Sn is preferred because of its excellent handleability. Sodium or a sodium alloy can be supported on the surface of the porous aluminum by electroplating, hot dipping, or another method. Alternatively, a metal (such as Si) to be alloyed with sodium may be deposited on the porous aluminum by plating and converted into a sodium alloy by charging the molten salt battery.

FIG. 6 is a schematic cross-sectional view of a molten salt battery manufactured by using the battery electrode material described above. The molten salt battery includes a positive electrode 121, in which a positive electrode active material is supported on the surface of the aluminum skeleton of porous aluminum, a negative electrode 122, in which a negative electrode active material is supported on the surface of the aluminum skeleton of porous aluminum, and a separator 123 impregnated with a molten salt electrolyte, in a case 127. A pressing member 126 is disposed between the top surface of the case 127 and the negative electrode. The pressing member 126 includes a presser plate 124 and a spring 125 for pressing the presser plate. The pressing member 126 can uniformly press the positive electrode 121, the negative electrode 122, and the separator 123 into contact with one another even when the volumes of them have changed. A collector (porous aluminum) of the positive electrode 121 and a collector (porous aluminum) of the negative electrode 122 are connected to a positive electrode terminal 128 and a negative electrode terminal 129, respectively, through a lead wire 130.

The molten salt serving as an electrolyte may be an inorganic salt or an organic salt that can melt at the operating temperature. The cation of the molten salt may be one or more selected from alkaline metals, such as lithium (Li), sodium (Na), potassium (K), rubidium (Rb), and cesium (Cs), and alkaline earth metals, such as beryllium (Be), magnesium (Mg), calcium (Ca), strontium (Sr), and barium (Ba).

In order to decrease the melting point of the molten salt, it is preferable to use a mixture of at least two salts. For example, use of potassium bis(fluorosulfonyl)amide (KFSA) and sodium bis(fluorosulfonyl)amide (NaFSA) in combination can decrease the battery operating temperature to 90° C. or less.

The molten salt is used in the form of a separator impregnated with the molten salt. The separator prevents the contact between the positive electrode and the negative electrode and may be a glass nonwoven fabric or porous resin. A laminate of the positive electrode, the negative electrode, and the separator impregnated with the molten salt housed in a case is used as a battery.

(Electrical Double Layer Capacitor)

The porous aluminum can also be used as an electrode material for electrical double layer capacitors. When the porous aluminum is used as an electrode material for an electrical double layer capacitor, the electrode active material may be activated carbon. The activated carbon is used in combination with a conduction aid or a binder. The conduction aid may be graphite or carbon nano-tube. The binder may be polytetrafluoroethylene (PTFE) or styrene-butadiene rubber.

FIG. 7 is a schematic cross-sectional view of an electrical double layer capacitor manufactured by using the electrode material for an electrical double layer capacitor. A polarizable electrode 141 is disposed in an organic electrolyte 143 partitioned with a separator 142. The polarizable electrode 141 is made of an electrode material, which is an electrode active material supported on the porous aluminum. The electrode polarizable material 141 is connected to a lead wire 144. All the components are housed in a case 145. Use of the porous aluminum as a collector can increase the surface area of the collector. Thus, even a thin layer of activated carbon as the active material on the surface of the porous aluminum can result in an electrical double layer capacitor with a high power and a high capacity.

Although the resin expansion molded body is used as the resin molded body as described above, the present invention is not limited to the resin expansion molded body. A resin molded body having any shape can be used to manufacture an aluminum structural body having a desired shape.

EXAMPLE 2

An example of the manufacture of porous aluminum will be specifically described below. A urethane foam having a thickness of 1 mm, a porosity of 95%, and approximately 50 pores (cells) per inch was prepared as a resin expansion molded body and was cut into 140 mm×340 m.

(Formation of Nickel Electrically Conductive Layer)

The electroless nickel plating of a surface of urethane foam was performed to form an electrically conductive layer. The treatment process is described below.

Hydrophilic treatment: alkaline+cationic surfactant+non-ionic surfactant, 50° C., 2 minutes Water washing Acid treatment: 8% hydrochloric acid, room temperature, 30 seconds Catalyst loading: hydrochloric acid+Catalyst C (Okuno Chemical Industries Co., Ltd.), 20° C., 3 minutes Water washing Activation: sulfuric acid+Accelerator X (Okuno Chemical Industries Co., Ltd.), 45° C., 2 minutes Water washing Electroless plating: the pH of a plating liquid (nickel sulfate: 22 g/L, sodium hypophosphite: 20 g/L, sodium citrate: 40 g/L, ammonium borate: 10 g/L, stabilizing agent: 1 ppm) was adjusted to 9 with aqueous ammonia, 35° C., 3 minutes Water washing Drying The mass per unit area of the electroless Ni plating thus performed was 10 $g/m^2$, and the composition was Ni-3% by weight P.

(Molten Salt Plating 1)

The urethane foam having an electrically conductive layer on the surface thereof was mounted in a jig having an electricity supply function and was then dipped in a molten salt aluminum plating bath (17% by mole EMIC-34% by mole $AlCl_3$-49% by mole xylene) at a temperature of 40° C. The jig holding the urethane foam was connected to the cathode of a rectifier, and an aluminum plate (purity 99.99%) of the counter electrode was connected to the anode. A direct current was applied at a current density of 3.6 $A/dm^2$ for 60 minutes to perform aluminum plating. Agitation was performed with a stirrer having a Teflon (registered trademark) rotor. The electric current density was calculated on the basis of the apparent area of the porous aluminum (the actual surface area of the urethane foam was approximately eight times the apparent area). As a result, 120 $g/m^2$ of aluminum plating was almost uniformly formed.

(Molten Salt Plating 2)

Plating was performed in the same manner as described above except that a molten salt aluminum plating bath (33% by mole EMIC-67% by mole $AlCl_3$) at a temperature of 40° C. was used as a plating bath, forming 120 $g/m^2$ of porous aluminum.

Figure 9:
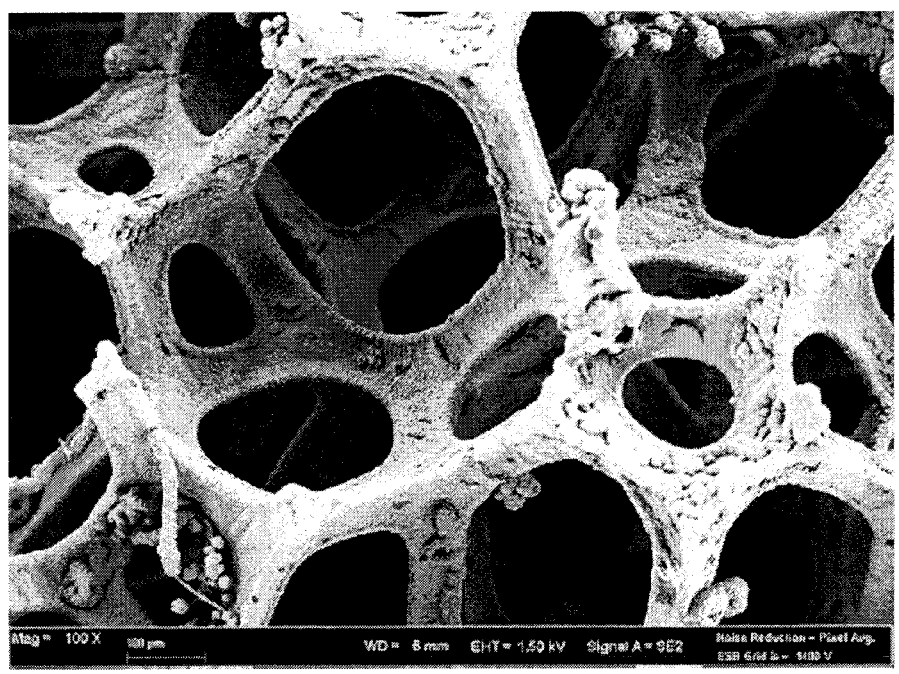
FIG. 9 is a SEM photograph of porous aluminum according to one example of the second embodiment of the present invention.
Figure 10:
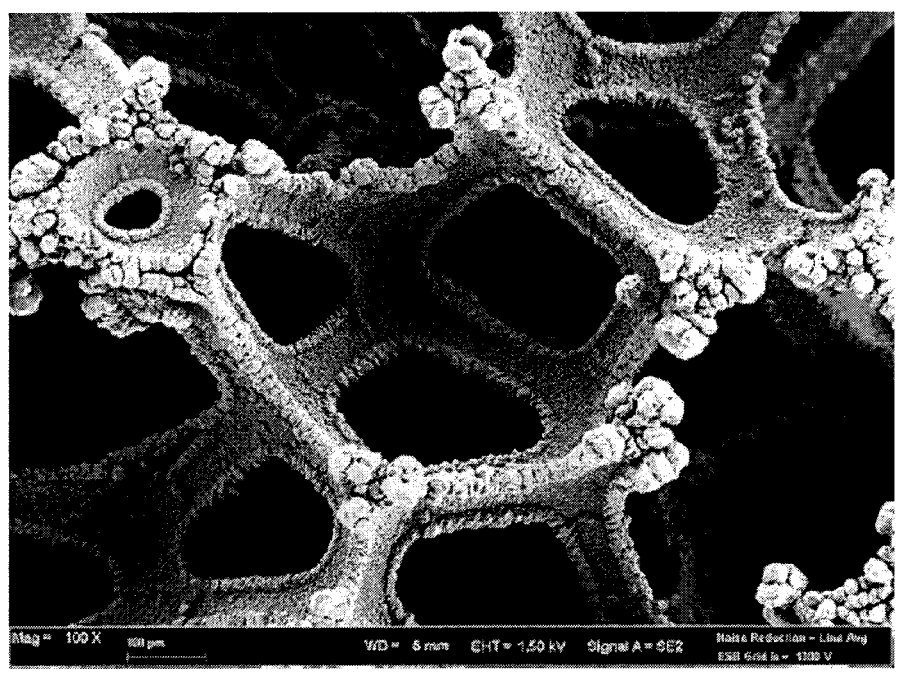
FIG. 10 is a SEM photograph of porous aluminum according to another example of the second embodiment of the present invention.

FIG. 9 (Plating 1) and FIG. 10 (Plating 2) are scanning electron microscope (SEM) photographs of the porous aluminum thus formed. Plating without xylene (FIG. 10) resulted in relatively large surface irregularities. Particularly in the vicinity of the ridgeline of the skeleton, plating seems to grow in a granular form. In contrast, plating with xylene (FIG. 9) results in a very smooth surface.

Figure 11:
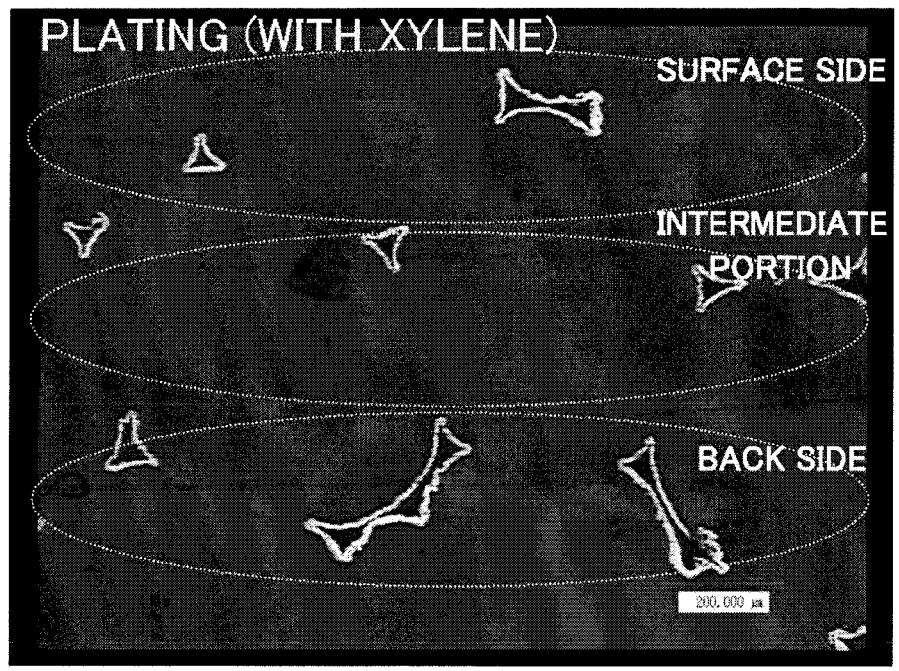
FIG. 11 is a photograph of a cross section of skeleton of porous aluminum according to one example of the second embodiment of the present invention in the thickness direction.
Figure 12:
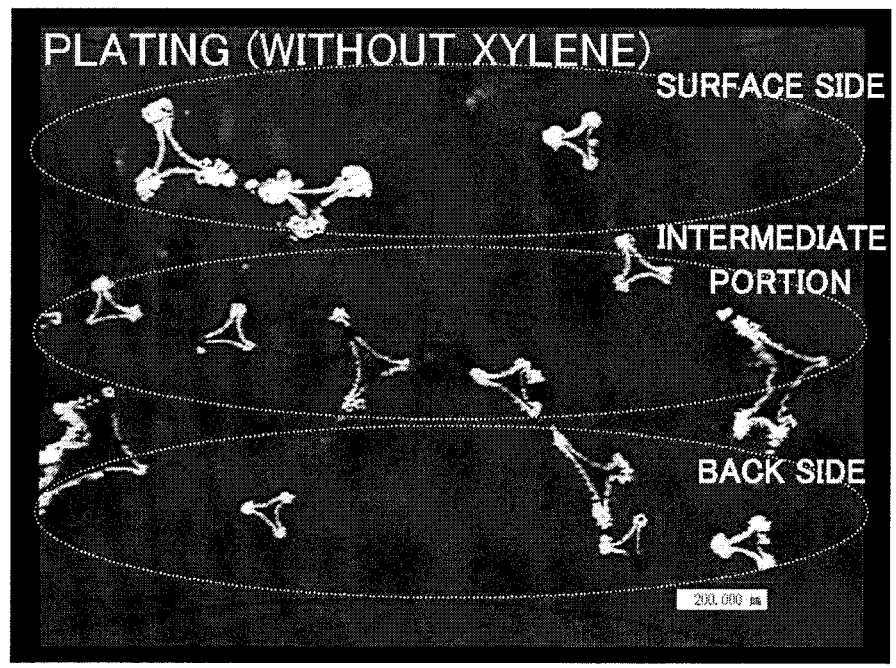
FIG. 12 is a photograph of a cross section of skeleton of porous aluminum according to another example of the second embodiment of the present invention in the thickness direction.

FIG. 11 shows a cross-section of the porous aluminum shown in FIG. 9 prepared in the molten salt plating 1 parallel to the thickness direction. FIG. 12 shows a cross-section of the porous aluminum shown in FIG. 10 prepared in the molten salt plating 2 parallel to the thickness direction. In FIGS. 11 and 12, the vertical direction is the thickness direction of the porous body. Among the regions surrounded by the dotted lines, the upper region corresponds to the surface side, the central region corresponds to the intermediate portion, and the lower region corresponds to the back side. In actual plating, there is no distinction between the front side and the back side. Thus, one surface is temporarily referred to as the surface side, and the other surface is referred to as the back side. The regions surrounded by the dotted lines show rough distinctions for convenience of explanation and do not have particular boundaries. Since the cross-sections of the urethane skeleton are almost triangular, the aluminum layers formed on the surfaces seem to have almost triangular sections. The xylene-added bath in FIG. 11 has generally more uniform aluminum layers than in FIG. 12. More specifically, each side of one almost triangular section is much more uniform in FIG. 11 than in FIG. 12, although the vertexes have a slightly greater thickness than the sides in FIG. 11. The surface side, the intermediate portion, and the back side of the entire porous body in the thickness direction have little difference in the plating thickness. This is consistent with the very smooth surface of the skeleton in the surface observation. In FIG. 12, plating has a very large thickness in the vicinity of the vertexes of each of the almost triangular sections. This seems to be a granular appearance in the surface observation. The intermediate portion has a smaller plating thickness than the surface side or the back side.

(Decomposition of Resin Expansion Molded Body)

The resin foam having the aluminum plated layer was dipped in a LiCl—KCl eutectic molten salt at a temperature of 500° C. A negative potential of −1 V was applied to the resin foam for 30 minutes. Air bubbles were generated in the molten salt, indicating the decomposition reaction of the polyurethane. The product was cooled to room temperature in the atmosphere and was washed with water to remove the molten salt, thus forming porous aluminum.

(Removal of Electrically Conductive Layer)

The porous aluminum was dipped in a 67.5% concentrated nitric acid solution at room temperature for five minutes, was washed with water, and was dried to dissolve nickel in the electrically conductive layer. Although nickel is dissolved in the concentrated nitric acid solution, aluminum forms a passivation film on the surface thereof in an oxidizing acid and is not dissolved in the acid. Thus, nickel is almost completely removed, and porous aluminum having a high aluminum purity can be manufactured.

The porous aluminum was dissolved in nitromuriatic acid and was analyzed with an inductively-coupled plasma emission spectrometer. The aluminum purity had a purity of 98.25% by weight and contained 0.7% nickel, 0.05% phosphorus, and 1.0% by weight carbon. The energy dispersive X-ray spectroscopy (EDX) of the surface at an accelerating voltage of 15 kV showed a negligible oxygen peak, indicating that the oxygen content of the porous aluminum was lower than the detection limit of EDX (3.1% by mass).

(Evaluation of Porous Aluminum in Battery)

The practical evaluation of porous aluminum used as a battery electrode will be described below in comparison with a conventional structure having an aluminum foil electrode.

A positive electrode active material $LiCoO_2$ having an average particle diameter of 7 µm, a conduction aid carbon black, and a binder resin polyvinylidene fluoride were mixed at 10:1:1 (mass ratio). A solvent N-methyl-2-pyrrolidone was added to the mixture to prepare a paste. Porous aluminum having a three-dimensional network structure and a porosity of approximately 95% was filled with the paste, was dried under vacuum at 150° C., and was role-pressed to a thickness corresponding to 70% of the initial thickness to form a battery electrode material (positive electrode). The battery electrode material was punched in a diameter of 10 mm and was fixed to a coin battery container made of stainless steel SUS304 by spot welding. The positive electrode capacity was 2.4 mAh.

For comparison purposes, the mixture paste of $LiCoO_2$, carbon black, and polyvinylidene fluoride was applied to aluminum foil having a thickness of 20 µm and was dried and role-pressed in the same manner as described above to prepare a battery electrode material (positive electrode). The battery electrode material was punched in a diameter of 10 mm and was fixed to a coin battery container made of stainless steel SUS304 by spot welding. The positive electrode capacity was 0.24 mAh.

A polypropylene porous film having a thickness of 25 µm was used as a separator. A solution of 1 M $LiPF_6$ in EC/DEC (volume ratio 1:1) was dropped at 0.1 ml/cm$^2$ on the separator, which was then subjected to vacuum impregnation. A lithium aluminum foil having a thickness of 20 µm and a diameter of 11 mm was fixed to the top lid of a coin battery container as a negative electrode. The battery electrode material (positive electrode), the separator, and the negative electrode were laminated in this order and were caulked with a Viton (registered trademark) o-ring placed between the top lid and the bottom lid to manufacture a battery. In charge and discharge, the upper limit voltage was 4.2 V, and the lower limit voltage was 3.0 V. Charging to the positive electrode capacity was followed by discharging at each discharge rate. The lithium secondary battery containing the porous aluminum as the positive electrode material had a capacity approximately five times the capacity of a conventional battery containing aluminum foil as the electrode material at 0.2 C. A problem of a short circuit was not observed also in the life test of the lithium-ion battery. A life-cycle test was performed on the basis of the cycle life described in Japan Industrial Standard C 8711. In charge and discharge, the upper limit voltage was 4.2 V, and the lower limit voltage was 3.0 V. A cycle of charging to the positive electrode capacity and discharging at a discharge rate of 0.2 C was performed multiple times. The lithium secondary battery that included the porous aluminum as the positive electrode material exhibited no reduction in voltage or capacity and did not cause a problem in the cycling characteristics as compared with the battery containing aluminum foil as the electrode material.

Figure 13:
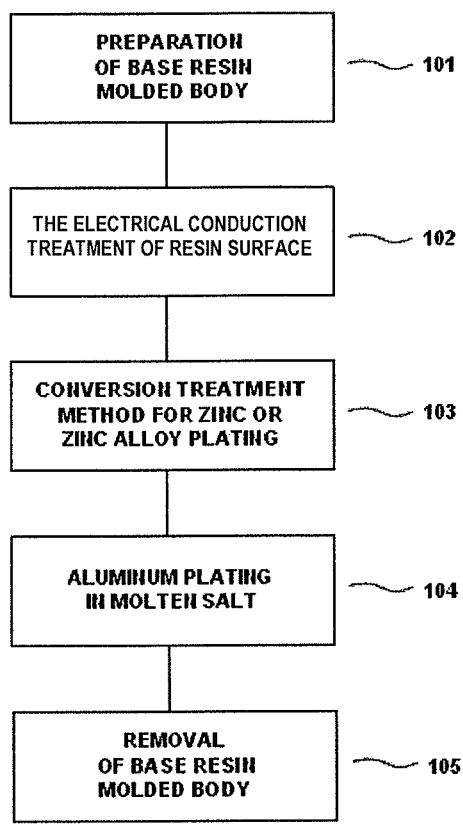
FIG. 13 is a flow chart of a process of manufacturing an aluminum structure structural body according to a third embodiment of the present invention.

Process of Manufacturing Aluminum Structure Structural Body According to Third Embodiment of Present Invention FIG. 13 is a flow chart of a process of manufacturing an aluminum structural body according to a third embodiment of the present invention. As illustrated in FIG. 2, an aluminum structural body is manufactured in the same manner as in the first embodiment of the present invention, in which an aluminum plated layer 3 is formed on a surface of a base resin molded body serving as the base material. As illustrated in FIG. 2(b), a thin electrically conductive layer 2 made of aluminum is formed on the surface of the resin expansion molded body 1. A process of forming a zinc film by a conversion treatment method for zinc or zinc alloy plating 103 is then performed on a surface of the electrically conductive layer 2. The deposited zinc film is very thin and is not shown in FIG. 2. Aluminum plating in a molten salt 104 is then performed to form an aluminum plated layer 3 on the surface of the electrically conductive layer of the resin molded body (FIG. 2(*c*)). Thus, an aluminum structure structural body is manufactured in which the aluminum plated layer 3 is formed on a surface of a base resin molded body serving as the base material. Removal of the base resin molded body 105 may be further performed. The resin expansion molded body 1 can be evaporated by decomposition to form an aluminum structural body (porous body) containing only the metal layer (FIG. 2(*d*)).

These processes will be described below process by process.

(Preparation of Porous Resin Molded Body)

A porous resin molded body having a three-dimensional network structure and continuous pores is prepared in the same manner as in the first embodiment of the present invention. The material of the porous resin molded body may be any resin. The material may be exemplified by a resin expansion molded body made of polyurethane, melamine, polypropylene, or polyethylene.

(Electrical Conduction Treatment of Resin Molded Body Surface: Gas Phase Method)

An electrically conductive layer made of aluminum is formed on the surface of a resin expansion molded body. The electrically conductive layer may be formed by any method, for example, a gas phase method, such as vapor deposition, sputtering, or plasma chemical vapor deposition (CVD), or application of an aluminum paint. A vapor deposition method is preferred because a thin film can be uniformly formed. The thickness of the electrically conductive layer ranges from 0.05 to 5 µm, preferably 0.1 to 3 µm. When the electrically conductive layer has a thickness of less than 0.05 µm, electrical conduction treatment is insufficient, and electrolytic plating cannot be properly performed in the next process. If the electrically conductive layer has an excessively thin thickness, this results in the formation of a defective zinc film in the process of the conversion treatment method for zinc or zinc alloy plating. A thickness of more than 5 µm results in an increase in the cost of the electrical conduction treatment process.

(Electrical Conduction Treatment of Resin Molded Body Surface: Coating Material)

The electrical conduction treatment may be performed by dipping a resin expansion molded body in a coating material containing aluminum. The aluminum component in the coating material is deposited on the surface of the resin expansion molded body to form an electrically conductive layer made of aluminum, producing an electrically conductive state that allows plating in a molten salt. The coating material containing aluminum may be a liquid containing aluminum fine particles having a particle diameter in the range of 10 nm to 1 µm dispersed in water or an organic solvent. The resin foam can be dipped in the coating material and heated to evaporate the solvent to form the electrically conductive layer.

(Conductive Treatment of Resin Molded Body Surface: Coating Material)

The conductive treatment may be performed by dipping a resin expansion molded body in a coating material containing aluminum. The aluminum component in the coating material is deposited on the surface of the resin expansion molded body to form an electrically conductive layer made of aluminum, producing an electrically conductive state that allows plating in a molten salt. The coating material containing aluminum may be a liquid containing aluminum fine particles having a particle diameter in the range of 10 nm to 1 µm dispersed in water or an organic solvent. The resin foam can be dipped in the coating material and heated to evaporate the solvent to form the electrically conductive layer.

(Formation of Zinc Film by Conversion Treatment Method for Zinc or Zinc Alloy Plating)

Aluminum is plated by molten salt plating on the electrically conductive layer formed by the process described above to form an aluminum plated layer. The presence of an oxide film on the surface of the electrically conductive layer may result in a poor adhesive property of aluminum in the next plating process, resulting in the deposition of island-shaped aluminum or variations in the thickness of the aluminum plated layer. Thus, before the plating process, a conversion treatment method for zinc or zinc alloy plating is performed to form a zinc film on the surface of the electrically conductive layer. The conversion treatment method for zinc or zinc alloy plating is performed as described below.

A resin molded body having an electrically conductive layer is dipped in a liquid for a conversion treatment method for zinc or zinc alloy plating. The liquid for a conversion treatment method for zinc or zinc alloy plating may be an aqueous solution of sodium hydroxide and zinc oxide or an aqueous solution of sodium hydroxide and zinc oxide in which iron(III) chloride is dissolved. If the liquid for a conversion treatment method for zinc or zinc alloy plating has a high temperature, this may result in high reactivity and consequently excessive dissolution of aluminum. Thus, the temperature of the liquid is preferably controlled in the range of 4° C. to 15° C.

When the conversion treatment method for zinc or zinc alloy plating is performed on a metal, such as an aluminum alloy, a preliminary treatment is generally performed. The preliminary treatment involves a soft etching treatment for removing an oxide film on the surface of aluminum with an alkaline etchant and a desmut treatment (dissolution residue treatment) with nitric acid. After water washing, the surface from which the oxide film has been removed is brought into contact with the liquid for a conversion treatment method for zinc or zinc alloy plating. However, such a treatment performed on a thin aluminum layer formed on the surface of the resin molded body may excessively dissolve the aluminum layer surface with the etchant. Thus, dipping in the liquid for a conversion treatment method for zinc or zinc alloy plating without preliminary treatment, such as etching, is preferred.

A double zincate treatment may be performed in which the conversion treatment method for zinc or zinc alloy plating is performed multiple times. In this case, after a zinc film is formed by a conversion treatment method for zinc or zinc alloy plating, a peel treatment of the zinc film with nitric acid or the like is performed, and the conversion treatment method for zinc or zinc alloy plating is performed again. The double zincate treatment can form a zinc film having a dense structure, increase the adhesion between the electrically conductive layer and the plated layer, and reduce the dissociation of zinc from the aluminum structural body.

(Formation of Aluminum Layer: Molten Salt Plating)

The aluminum plated layer 3 is then formed on the surface of the resin molded body by electrolytic plating in a molten salt. A direct current is applied between a cathode of the resin molded body having a surface subjected to electrical conduction treatment and an anode of a 99.99% aluminum plate in a molten salt. The thickness of the aluminum plated layer ranges from 1 to 100 µm, preferably 5 to 20 µm. In contrast to the anode electrolysis treatment, a direct current is applied between a cathode of the resin molded body subjected to electrical conduction treatment and an anode of the counter electrode in a molten salt. The molten salt may be an organic molten salt that is an eutectic salt of an organic halide and an aluminum halogenide or an inorganic molten salt that is an eutectic salt of an alkaline metal halide and an aluminum halogenide. Use of a bath of an organic molten salt that can melt at a relatively low temperature is preferred because it allows plating without the decomposition of the base material, a resin molded body. The organic halide may be an imidazolium salt or a pyridinium salt. Among others, 1-ethyl-3-methylimidazolium chloride (EMIC) and butylpyridinium chloride (BPC) are preferred. The imidazolium salt is preferably a salt that contains an imidazolium cation having alkyl groups at 1,3-position. In particular, aluminum chloride and 1-ethyl-3-methylimidazolium chloride ($AlCl_3$-EMIC) molten salts are most preferred because of their high stability and resistance to decomposition.

The contamination of a molten salt by water or oxygen causes a deterioration of the molten salt. Thus, plating is preferably performed in an atmosphere of an inert gas, such as nitrogen or argon, in a sealed environment. When an EMIC bath is used as the organic molten salt bath, the temperature of the plating bath ranges from 10° C. to 60° C., preferably 25° C. to 45° C.

FIG. 5 is a schematic view of an apparatus for continuously performing a metal plating treatment of a strip of resin. A strip of resin 22 having a surface subjected to electrical conduction treatment is transferred from the left to the right in the figure. A plating bath 21a includes a cylindrical electrode 24, a positive electrode 25 disposed on the inner wall of a container, and a plating bath 23. The strip of resin 22 passes through the plating bath 23 along the cylindrical electrode 24. Thus, a uniform electric current can easily flow through the entire resin, achieving uniform plating. A plating bath 21b for performing thick uniform plating is composed of a plurality of baths so that plating can be performed multiple times. The strip of resin 22 having a thin metal layer on a surface thereof is transferred by electrode rollers 26, which function as feed rollers and power feeding cathodes on the outside of container, through a plating bath 28 to perform plating. The plurality of baths include positive electrodes 27 facing both faces of the resin via the plating bath 28, allowing more uniform plating on both faces of the resin.

An aluminum structural body (porous aluminum) having a resin molded body as the core of its skeleton is manufactured through these processes. Depending on the application, such as a filter or a catalyst support, the aluminum structural body may be directly used as a resin-metal composite. In order to use a metal structure without resin because of constraints resulting from the usage environment, the resin may be removed. The resin may be removed by decomposition (dissolution) with an organic solvent, a molten salt, or supercritical water, decomposition by heating, or any other method. Decomposition by heating at high temperature is convenient but causes the oxidation of aluminum. Unlike nickel, once oxidized, aluminum is difficult to reduce. Thus, for use in an electrode material for batteries, aluminum cannot be used because its conductive property is lost by oxidation. In order to prevent the oxidation of aluminum, therefore, a method for removing a resin by decomposition by heating in a molten salt as described below is preferably used.

(Removal of Resin: Decomposition by Heating in Molten Salt)

Decomposition by heating in a molten salt is performed in the following manner. A resin expansion molded body having an aluminum plated layer on a surface thereof is dipped in a molten salt. The resin expansion molded body is decomposed by heating while a negative potential is applied to the aluminum layer. The application of the negative potential while dipping the resin expansion molded body in the molten salt can prevent the oxidation of aluminum. Heating under such conditions allows the decomposition of the resin expansion molded body without the oxidation of aluminum. The heating temperature can be appropriately determined in accordance with the type of the resin expansion molded body. The heating temperature must be lower than the melting point (660° C.) of aluminum so as not to melt aluminum. A preferred temperature range is 500° C. or more and 600° C. or less. A negative potential to be applied is on the minus side of the reduction potential of aluminum and on the plus side of the reduction potential of the cation in a molten salt.

The molten salt used in the decomposition of a resin by heating may be an alkaline metal or alkaline earth metal halide salt such that the aluminum electrode potential is less-noble. More specifically, a preferred molten salt contains one or more selected from the group consisting of lithium chloride (LiCl), potassium chloride (KCl), sodium chloride (NaCl), and aluminum chloride ($AlCl_3$). Removal of the resin by such a method can result in porous aluminum having a thin oxide layer on a surface thereof (a low oxygen content) and a low carbon content.

FIG. 4 is a schematic view of a cross-section taken along the line A-A' in FIG. 2(d). An aluminum layer composed of the electrically conductive layer 2 and the aluminum plated layer 3 has a tubular skeleton structure. A cavity 4 in the skeleton structure has almost triangular sections. The thickness (t1) including the electrically conductive layer of the aluminum layer at the vertexes of each of the triangular sections is greater than the thickness (t2) at the middle of each side of the triangular sections. This is probably because an electric field is concentrated at the corners (the vertexes of a triangular section) in the formation of the aluminum layer by plating. Thus, in an aluminum structural body manufactured by a method according to the present invention, the skeleton structure has almost triangular sections, and the aluminum layer has a larger thickness at the vertexes of each of the triangular sections than at the middle of each side of the triangular sections.

(Lithium-Ion Battery)

A battery electrode material and a battery each including porous aluminum will be described below. When porous aluminum is used in a positive electrode of a lithium-ion battery, the active material may be lithium cobalt oxide ($LiCoO_2$), lithium manganese oxide ($LiMn_2O_4$), or lithium nickel dioxide ($LiNiO_2$). The active material is used in combination with a conduction aid and a binder. In a known positive electrode material for lithium-ion batteries, an active material is applied to the surface of aluminum foil. In order to increase the battery capacity per unit area, the application thickness of the active material is increased. In order to effectively utilize the active material, the active material must be in electrical contact with the aluminum foil. Thus, the active material is mixed with a conduction aid. Porous aluminum according to the present invention has a high porosity and a large surface area per unit volume. Thus, even a thin layer of the active material on the surface of the porous aluminum can effectively utilize the active material, increasing the battery capacity and decreasing the amount of conduction aid to be mixed with. Lithium-ion batteries include the positive electrode material described above as the positive electrode, graphite as the negative electrode, and an organic electrolyte as the electrolyte. Such lithium-ion batteries can have an increased capacity even with a small electrode area and accordingly have a higher energy density than conventional lithium-ion batteries.

(Molten Salt Battery)

The porous aluminum can also be used as an electrode material for molten salt batteries. When the porous aluminum is used as a positive electrode material, the active material is a metal compound, such as sodium chromite ($NaCrO_2$) or titanium disulfide, ($TiS_2$) into which a cation of a molten salt serving as an electrolyte can be intercalated. The active material is used in combination with a conduction aid and a binder. The conduction aid may be acetylene black. The binder may be polytetrafluoroethylene (PTFE). For the active material of sodium chromate and the conduction aid of acetylene black, the binder is preferably PTFE because PTFE can tightly bind sodium chromate and acetylene black.

The porous aluminum can also be used as a negative electrode material for molten salt batteries. When the porous aluminum is used as a negative electrode material, the active material may be sodium alone, an alloy of sodium and another metal, or carbon. Sodium has a melting point of approximately 98° C. and becomes softer with an increase in temperature. Thus, it is preferable to alloy sodium with another metal (such as Si, Sn, or In). In particular, an alloy of sodium and Sn is preferred because of its excellent handleability. Sodium or a sodium alloy can be supported on the surface of the porous aluminum by electroplating, hot dipping, or another method. Alternatively, a metal (such as Si) to be alloyed with sodium may be deposited on the porous aluminum by plating and converted into a sodium alloy by charging the molten salt battery.

FIG. 6 is a schematic cross-sectional view of a molten salt battery manufactured by using the battery electrode material described above. The molten salt battery includes a positive electrode 121, in which a positive electrode active material is supported on the surface of the aluminum skeleton of porous aluminum, a negative electrode 122, in which a negative electrode active material is supported on the surface of the aluminum skeleton of porous aluminum, and a separator 123 impregnated with a molten salt electrolyte, in a case 127. A pressing member 126 is disposed between the top surface of the case 127 and the negative electrode. The pressing member 126 includes a presser plate 124 and a spring 125 for pressing the presser plate. The pressing member 126 can uniformly press the positive electrode 121, the negative electrode 122, and the separator 123 into contact with one another even when the volumes of them have changed. A collector (porous aluminum) of the positive electrode 121 and a collector (porous aluminum) of the negative electrode 122 are connected to a positive electrode terminal 128 and a negative electrode terminal 129, respectively, through a lead wire 130.

The molten salt serving as an electrolyte may be an inorganic salt or an organic salt that can melt at the operating temperature. The cation of the molten salt may be one or more selected from alkaline metals, such as lithium (Li), sodium (Na), potassium (K), rubidium (Rb), and cesium (Cs), and alkaline earth metals, such as beryllium (Be), magnesium (Mg), calcium (Ca), strontium (Sr), and barium (Ba).

In order to decrease the melting point of the molten salt, it is preferable to use a mixture of at least two salts. For example, use of potassium bis(fluorosulfonyl)amide (KFSA) and sodium bis(fluorosulfonyl)amide (NaFSA) in combination can decrease the battery operating temperature to 90° C. or less.

The molten salt is used in the form of a separator impregnated with the molten salt. The separator prevents the contact between the positive electrode and the negative electrode and may be a glass nonwoven fabric or porous resin. A laminate of the positive electrode, the negative electrode, and the separator impregnated with the molten salt housed in a case is used as a battery.

(Electrical Double Layer Capacitor)

The porous aluminum can also be used as an electrode material for electrical double layer capacitors. When the porous aluminum is used as an electrode material for an electrical double layer capacitor, the electrode active material may be activated carbon. The activated carbon is used in combination with a conduction aid or a binder. The conduction aid may be graphite or carbon nano-tube. The binder may be polytetrafluoroethylene (PTFE) or styrene-butadiene rubber.

FIG. 7 is a schematic cross-sectional view of an electrical double layer capacitor manufactured by using the electrode material for an electrical double layer capacitor. A polarizable electrode 141 is disposed in an organic electrolyte 143 partitioned with a separator 142. The polarizable electrode 141 is made of an electrode material, which is an electrode active material supported on the porous aluminum. The electrode polarizable material 141 is connected to a lead wire 144. All the components are housed in a case 145. Use of the porous aluminum as a collector can increase the surface area of the collector. Thus, even a thin layer of activated carbon as the active material on the surface of the porous aluminum can result in an electrical double layer capacitor with a high power and a high capacity.

Although the resin expansion molded body is used as the resin molded body as described above, the present invention is not limited to the resin expansion molded body. A resin molded body having any shape can be used to manufacture an aluminum structural body having a desired shape.

Example

Manufacture of Porous Aluminum: Formation of Aluminum Layer by Vapor Deposition Method An example of the manufacture of porous aluminum will be specifically described below. A urethane foam having a thickness of 1.6 mm, a porosity of 95%, and approximately 20 pores per centimeter was prepared as a resin expansion molded body and was cut into a 140 mm×190 mm square. Vapor deposition of aluminum on the surface of the urethane foam was performed to form an electrically conductive layer having a thickness of approximately 2.5 μm.

(Conversion Treatment Method for Zinc or Zinc Alloy Plating)

A resin molded body having an electrically conductive layer was dipped for 15 seconds in a liquid for a conversion treatment method for zinc or zinc alloy plating (manufactured by Okuno Chemical Industries Co., Ltd., Subster ZN) the temperature of which had been adjusted to 10° C. to perform a conversion treatment method for zinc or zinc alloy plating. After water washing and drying, a resin composition having a zinc film was obtained.

(Molten Salt Plating)

A jig holding a urethane foam was connected to the cathode of a rectifier, and an aluminum plate (purity 99.99%) of the counter electrode was connected to the anode. The jig can supply electricity through four sides of the urethane foam and allows plating in a 100 mm×150 mm area. The jig was dipped in a molten salt aluminum plating bath (67% by mole $AlCl_3$-33% by mole EMIC) at a temperature of 40° C. A direct current was applied to the jig at an electric current density of 3.6 A/dm² for 60 minutes to perform aluminum plating. Agitation was performed with a stirrer having a Teflon (registered trademark) rotor. These procedures were performed in an argon atmosphere at low humidity (a dew-point temperature of −30° C. or less) in a glove box. The electric current density was calculated on the basis of the apparent area of the porous aluminum (the actual surface area of the urethane foam was approximately eight times the apparent area). As a result, 120 g/m$^2$ of aluminum plating was almost uniformly formed.

Figure 14:
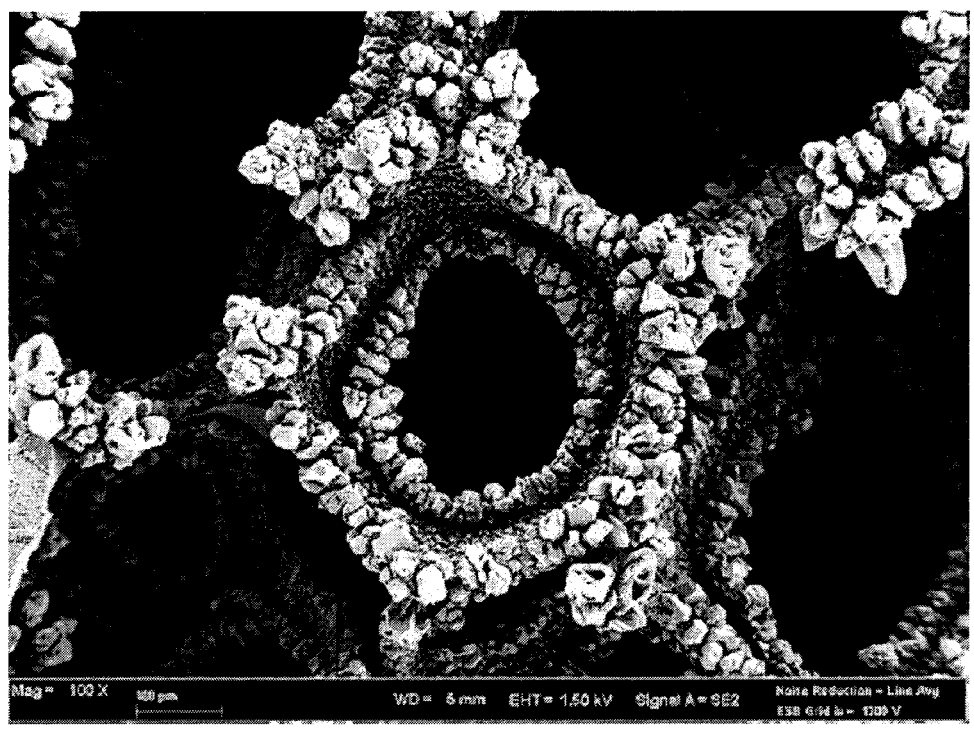
FIG. 14 is a SEM photograph of a cross section of porous aluminum according to a third embodiment of the present invention.

Manufacture of Porous Aluminum According to Third Embodiment of Present Invention Decomposition of Resin Expansion Molded Body The resin foam having the aluminum plated layer was dipped in a LiCl—KCl eutectic molten salt at a temperature of 500° C. A negative potential of −1 V was applied to the resin foam for 30 minutes. Air bubbles were generated in the molten salt, indicating the decomposition reaction of the polyurethane. The product was cooled to room temperature in the atmosphere and was washed with water to remove the molten salt, thus forming porous aluminum. FIG. 14 is a scanning electron microscope (SEM) photograph of the porous aluminum.

The porous aluminum was dissolved in nitromuriatic acid and was analyzed with an inductively-coupled plasma emission spectrometer. The carbon content was measured by an infrared absorption method after combustion in a high-frequency induction furnace in accordance with Japan Industrial Standard G1211. The aluminum purity was 99.48% by mass. The porous aluminum contained 0.5% by mass carbon and 0.02% by mass zinc. The energy dispersive X-ray spectroscopy (EDX) of the surface at an accelerating voltage of 15 kV showed a negligible oxygen peak, indicating that the oxygen content of the porous aluminum was lower than the detection limit of EDX (3.1% by mass).

(Evaluation of Porous Aluminum in Battery)

The practical evaluation of porous aluminum used as a battery electrode will be described below in comparison with a conventional structure having an aluminum foil electrode.

A positive electrode active material $LiCoO_2$ having an average particle diameter of 7 μm, a conduction aid carbon black, and a binder resin polyvinylidene fluoride were mixed at 10:1:1 (mass ratio). A solvent N-methyl-2-pyrrolidone was added to the mixture to prepare a paste. Porous aluminum having a three-dimensional network structure and a porosity of approximately 95% was filled with the paste, was dried under vacuum at 150° C., and was role-pressed to a thickness corresponding to 70% of the initial thickness to form a battery electrode material (positive electrode). The battery electrode material was punched in a diameter of 10 mm and was fixed to a coin battery container made of stainless steel SUS304 by spot welding. The positive electrode capacity was 2.4 mAh.

For comparison purposes, the mixture paste of $LiCoO_2$, carbon black, and polyvinylidene fluoride was applied to aluminum foil having a thickness of 20 μm and was dried and role-pressed in the same manner as described above to prepare a battery electrode material (positive electrode). The battery electrode material was punched in a diameter of 10 mm and was fixed to a coin battery container made of stainless steel SUS304 by spot welding. The positive electrode capacity was 0.24 mAh.

A polypropylene porous film having a thickness of 25 μm was used as a separator. A solution of 1 M $LiPF_6$ in EC/DEC (volume ratio 1:1) was dropped at 0.1 ml/cm$^2$ on the separator, which was then subjected to vacuum impregnation. A lithium aluminum foil having a thickness of 20 μM and a diameter of 11 mm was fixed to the top lid of a coin battery container as a negative electrode. The battery electrode material (positive electrode), the separator, and the negative electrode were laminated in this order and were caulked with a Viton (registered trademark) o-ring placed between the top lid and the bottom lid to manufacture a battery. In charging and discharging, the upper limit voltage was 4.2 V, and the lower limit voltage was 3.0 V. Charging to the positive electrode capacity was followed by discharging at each discharge rate. The lithium secondary battery containing the porous aluminum as the positive electrode material had a capacity approximately five times the capacity of a conventional battery containing aluminum foil as the electrode material at 0.2 C. A life-cycle test was performed on the basis of the cycle life described in Japan Industrial Standard C 8711. In charge and discharge, the upper limit voltage was 4.2 V, and the lower limit voltage was 3.0 V. A cycle of charging to the positive electrode capacity and discharging at a discharge rate of 0.2 C was performed multiple times. The lithium secondary battery that included the porous aluminum as the positive electrode material exhibited no reduction in voltage or capacity and did not cause a problem in the cycling characteristics as compared with the battery containing aluminum foil as the electrode material.

Figure 15:
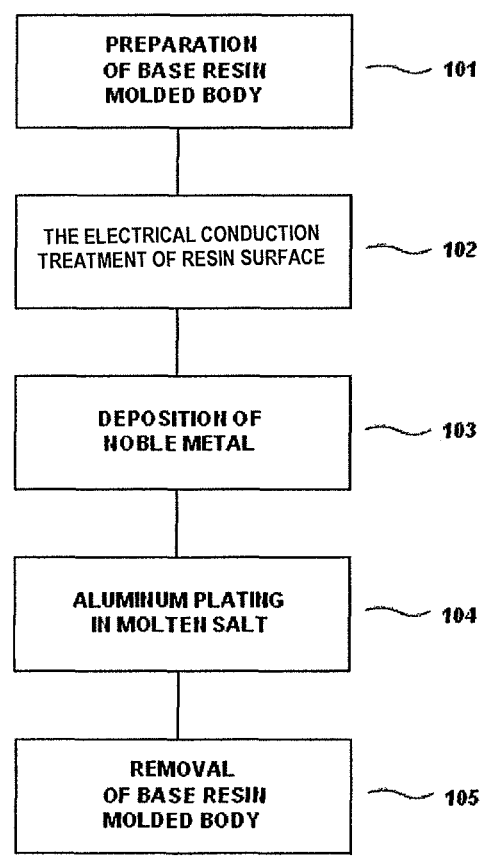
FIG. 15 is a flow chart of a process of manufacturing an aluminum structure structural body according to a fourth embodiment of the present invention.

Process of Manufacturing Aluminum Structural Body According to Fourth Embodiment of Present Invention FIG. 15 is a flow chart of a process of manufacturing an aluminum structural body according to a fourth embodiment of the present invention. FIG. 2 shows schematic views of the formation of an aluminum structure structural body using a resin molded body as a core material in accordance with the flow chart. As illustrated in FIG. 2(b), a thin electrically conductive layer 2 made of aluminum is formed on the surface of the resin expansion molded body 1. A process of depositing a noble metal 103 is then performed on a surface of the electrically conductive layer 2. The deposited noble metal is very thin and is not shown in FIG. 2. Aluminum plating in a molten salt 104 is then performed to form an aluminum plated layer 3 on the surface of the electrically conductive layer of the resin molded body (FIG. 2(c)). Thus, an aluminum structural body is manufactured in which the aluminum plated layer 3 is formed on a surface of a base resin molded body serving as the base material. Removal of the base resin molded body 105 may be further performed. The resin expansion molded body 1 can be evaporated by decomposition to form an aluminum structure structural body (porous body) containing only the metal layer (FIG. 2(d)).

These processes will be described below process by process.

(Preparation of Porous Resin Molded Body)

A porous resin molded body having a three-dimensional network structure and continuous pores is prepared in the same manner as in the first embodiment of the present invention. The material of the porous resin molded body may be any resin. The material may be exemplified by a resin expansion molded body made of polyurethane, melamine, polypropylene, or polyethylene.

(Electrical Conduction Treatment of Resin Molded Body Surface: Gas Phase Method)

An electrically conductive layer made of aluminum is formed on the surface of a resin expansion molded body. The electrically conductive layer may be formed by any method, for example, a gas phase method, such as vapor deposition, sputtering, or plasma chemical vapor deposition (CVD), or application of an aluminum paint. A vapor deposition method is preferred because a thin film can be uniformly formed. Preferably, the electrically conductive layer has a thickness in the range of 0.05 to 1 µm, preferably 0.1 to 0.5 µm. When the electrically conductive layer has a thickness of less than 0.01 µm, electrical conduction treatment is insufficient, and electrolytic plating cannot be properly performed in the next process. A thickness of more than 1 µm results in an increase in the cost of the electrical conduction treatment process.

(Electrical Conduction Treatment of Resin Molded Body Surface: Coating Material)

The electrical conduction treatment may be performed by dipping a resin expansion molded body in a coating material containing aluminum. The aluminum component in the coating material is deposited on the surface of the resin expansion molded body to form an electrically conductive layer made of aluminum, producing an electrically conductive state that allows plating in a molten salt. The coating material containing aluminum may be a liquid containing aluminum fine particles having a particle diameter in the range of 10 nm to 1 µm dispersed in water or an organic solvent. The resin foam can be dipped in the coating material and heated to evaporate the water to form the electrically conductive layer.

(Pretreatment for Plating: Deposition of Noble Metal)

Aluminum is plated by molten salt plating on the electrically conductive layer formed by the process described above to form an aluminum plated layer. The presence of an oxide film on the surface of the electrically conductive layer may result in a poor adhesive property of aluminum in the next plating process, resulting in the deposition of island-shaped aluminum or variations in the thickness of the aluminum plated layer. Thus, before the plating process, a noble metal is deposited on the surface of the electrically conductive layer (aluminum layer). The noble metal may be deposited by any method, for example, a gas phase method, such as vapor deposition, sputtering, or plasma chemical vapor deposition (CVD), electroless plating, or application of a coating material containing the noble metal. A vapor deposition method is preferred because a thin film can be uniformly formed. Since the noble metals are very expensive, a thin film is preferred in terms of cost. The noble metal layer has a thickness in the range of 0.0001 to 1 µm, preferably 0.001 to 0.01 µm. The noble metal layer having a thickness of less than 0.0001 µm cannot completely cover the oxide film of aluminum, resulting in poor plating. If the noble metal layer has a thickness of more than 1 µm, this results in an increase in the cost of the electrical conduction treatment process.

The following example describes the vapor deposition of gold on a surface of an electrically conductive layer formed on a urethane surface. Evaporation means is not particularly limited and may be a method for emitting an electron beam with an electron gun, resistance heating, induction heating, or a laser method. For uniform vapor deposition, an inert gas is preferably introduced around the urethane having the electrically conductive layer. The pressure of the introduced inert gas is 0.01 Pa or more. An inert gas pressure below 0.01 Pa results in poor deposition of the thin film, leaving an undeposited portion. The upper limit of the pressure of the inert gas atmosphere depends on the raw material heating method (such as an electron gun or resistance heating) and is preferably 1 Pa or less in terms of the amount of gas used and the deposition rate. Argon gas is suitably used as the inert gas. Argon gas is preferred because it is relatively abundant on the earth, is available at low cost, and has little adverse effects on the human body.

Vapor deposition of gold on a surface of urethane having an electrically conductive layer may be performed with an existing film-forming apparatus. For example, a vacuum evaporator that includes a film-forming chamber for partitioning a film formation target, a support and a heating container for mounting gold and the film formation target, respectively, and an electron gun for heating the gold can be suitably used. Use of the vacuum evaporator facilitates uniform introduction of an inert gas around urethane having an electrically conductive layer, which is a film formation target in the present invention, and facilitates the control of the inert gas pressure because a space around the urethane having an electrically conductive layer is partitioned. Thus, the use of the vacuum evaporator is preferred. First, urethane having an electrically conductive layer is mounted on the support in the vacuum evaporator, and gold is mounted on the heating container. The gold is a raw material of a thin film. Second, the film-forming chamber is evacuated to a high vacuum, and an inert gas is then introduced into the film-forming chamber. The pressure of the inert gas introduced into the film-forming chamber is adjusted in the range of 0.01 to 1 Pa. Finally, an electron beam is emitted from the electron gun to melt the gold, performing the deposition of a gold thin film on the urethane.

(Formation of Aluminum Layer: Molten Salt Plating)

The aluminum plated layer 3 is then formed on the surface of the resin molded body by electrolytic plating in a molten salt. A direct current is applied between a cathode of the resin molded body having a surface subjected to electrical conduction treatment and an anode of a 99.99% aluminum plate in a molten salt. The aluminum plated layer has a thickness in the range of 1 to 100 µm, preferably 5 to 20 µm. In contrast to the anode electrolysis treatment, a direct current is applied between a cathode of the resin molded body subjected to electrical conduction treatment and an anode of the counter electrode in a molten salt. The molten salt may be an organic molten salt that is an eutectic salt of an organic halide and an aluminum halogenide or an inorganic molten salt that is an eutectic salt of an alkaline metal halide and an aluminum halogenide. Use of a bath of an organic molten salt that can melt at a relatively low temperature is preferred because it allows plating without the decomposition of the base material, a resin molded body. The organic halide may be an imidazolium salt or a pyridinium salt. Among others, 1-ethyl-3-methylimidazolium chloride (EMIC) and butylpyridinium chloride (BPC) are preferred. The imidazolium salt is preferably a salt that contains an imidazolium cation having alkyl groups at 1,3-position. In particular, aluminum chloride and 1-ethyl-3-methylimidazolium chloride ($AlCl_3$-EMIC) molten salts are most preferred because of their high stability and resistance to decomposition.

The contamination of a molten salt by water or oxygen causes a deterioration of the molten salt. Thus, plating is preferably performed in an atmosphere of an inert gas, such as nitrogen or argon, in a sealed environment. When an EMIC bath is used as the organic molten salt bath, the temperature of the plating bath ranges from 10° C. to 60° C., preferably 25° C. to 45° C.

FIG. 5 is a schematic view of an apparatus for continuously performing a metal plating treatment of a strip of resin. A strip of resin 22 having a surface subjected to electrical conduction treatment is transferred from the left to the right in the figure. A first plating bath 21a includes a cylindrical electrode 24, a positive electrode 25 disposed on the inner wall of a container, and a plating bath 23. The strip of resin 22 passes through the plating bath 23 along the cylindrical electrode 24. Thus, a uniform electric current can easily flow through the entire resin, achieving uniform plating. A plating bath 21b for performing thick uniform plating is composed of a plurality of baths so that plating can be performed multiple times. The strip of resin 22 having a thin metal layer on a surface thereof is transferred by electrode rollers 26, which function as feed rollers and power feeding cathodes on the outside of container, through a plating bath 28 to perform plating. The plurality of baths include positive electrodes 27 facing both faces of the resin via the plating bath 28, allowing more uniform plating on both faces of the resin.

An aluminum structural body (porous aluminum) having a resin molded body as the core of its skeleton is manufactured through these processes. Depending on the application, such as a filter or a catalyst support, the aluminum structural body may be directly used as a resin-metal composite. In order to use a metal structure without resin because of constraints resulting from the usage environment, the resin may be removed. The resin may be removed by decomposition (dissolution) with an organic solvent, a molten salt, or supercritical water, decomposition by heating, or any other method. Decomposition by heating at high temperature is convenient but causes the oxidation of aluminum. Unlike nickel, once oxidized, aluminum is difficult to reduce. Thus, for use in an electrode material for batteries, aluminum cannot be used because its conductive property is lost by oxidation. In order to prevent the oxidation of aluminum, therefore, a method for removing a resin by decomposition by heating in a molten salt as described below is preferably used.

(Removal of Resin: Decomposition by Heating in Molten Salt)

Decomposition by heating in a molten salt is performed in the following manner. A resin expansion molded body having an aluminum plated layer on a surface thereof is dipped in a molten salt. The resin expansion molded body is decomposed by heating while a negative potential is applied to the aluminum layer. The application of the negative potential while dipping the resin expansion molded body in the molten salt can prevent the oxidation of aluminum. Heating under such conditions allows the decomposition of the resin expansion molded body without the oxidation of aluminum. The heating temperature can be appropriately determined in accordance with the type of the resin expansion molded body. The heating temperature must be lower than the melting point (660° C.) of aluminum so as not to melt aluminum. A preferred temperature range is 500° C. or more and 600° C. or less. A negative potential to be applied is on the minus side of the reduction potential of aluminum and on the plus side of the reduction potential of the cation in a molten salt.

The molten salt used in the decomposition of a resin by heating may be an alkaline metal or alkaline earth metal halide salt such that the aluminum electrode potential is less-noble. More specifically, a preferred molten salt contains one or more selected from the group consisting of lithium chloride (LiCl), potassium chloride (KCl), sodium chloride (NaCl), and aluminum chloride ($AlCl_3$). Removal of the resin by such a method can result in porous aluminum having a thin oxide layer on a surface thereof (a low oxygen content) and a low carbon content.

FIG. 4 is a schematic view of a cross-section taken along the line A-A' in FIG. 2(*d*). An aluminum layer composed of the electrically conductive layer 2 and the aluminum plated layer 3 has a tubular skeleton structure. A cavity 4 in the skeleton structure has almost triangular sections. The thickness (t1) including the electrically conductive layer of the aluminum layer at the vertexes of each of the triangular sections is greater than the thickness (t2) at the middle of each side of the triangular sections. This is probably because an electric field is concentrated at the corners (the vertexes of a triangular section) in the formation of the aluminum layer by plating. Thus, in an aluminum structural body manufactured by a method according to the present invention, the skeleton structure has almost triangular sections, and the aluminum layer has a larger thickness at the vertexes of each of the triangular sections than at the middle of each side of the triangular sections.

A noble metal layer is formed between the electrically conductive layer 2 and the aluminum plated layer 3. Noble metals rarely cause an oxidation-reduction reaction. Thus, when an aluminum structural body is used as a battery electrode, noble metals are rarely dissolved or deposited and rarely cause deterioration of the battery. Furthermore, the noble metal layer is disposed within the aluminum structural body, and the surface of the aluminum structural body in contact with an electrolyte solution has a high aluminum purity. Thus, the battery is rarely deteriorated. Even an aluminum structural body containing a minute amount of noble metal can be satisfactorily used as an electrode material for batteries. The total amount of gold, silver, platinum, rhodium, ruthenium, and palladium is 0.001% or more and 1.0% or less. The noble metal layer may diffuse into aluminum through a heating process, such as a process of decomposing resin.

(Lithium-Ion Battery)

A battery electrode material and a battery each including porous aluminum will be described below. When porous aluminum is used in a positive electrode of a lithium-ion battery, the active material may be lithium cobalt oxide ($LiCoO_2$), lithium manganese oxide ($LiMn_2O_4$), or lithium nickel dioxide ($LiNiO_2$). The active material is used in combination with a conduction aid and a binder. In a known positive electrode material for lithium-ion batteries, an active material is applied to the surface of aluminum foil. In order to increase the battery capacity per unit area, the application thickness of the active material is increased. In order to effectively utilize the active material, the active material must be in electrical contact with the aluminum foil. Thus, the active material is mixed with a conduction aid. Porous aluminum according to the present invention has a high porosity and a large surface area per unit volume. Thus, even a thin layer of the active material on the surface of the porous aluminum can effectively utilize the active material, increasing the battery capacity and decreasing the amount of conduction aid to be mixed with. Lithium-ion batteries include the positive electrode material described above as the positive electrode, graphite as the negative electrode, and an organic electrolyte as the electrolyte. Such lithium-ion batteries can have an increased capacity even with a small electrode area and accordingly have a higher energy density than conventional lithium-ion batteries.

(Molten Salt Battery)

The porous aluminum can also be used as an electrode material for molten salt batteries. When the porous aluminum is used as a positive electrode material, the active material is a metal compound, such as sodium chromate chromite ($NaCrO_2$) or titanium disulfide ($TiS_2$), into which a cation of a molten salt serving as an electrolyte can be intercalated. The active material is used in combination with a conduction aid and a binder. The conduction aid may be acetylene black. The binder may be polytetrafluoroethylene (PTFE). For the active material of sodium chromate and the conduction aid of acetylene black, the binder is preferably PTFE because PTFE can tightly bind sodium chromate and acetylene black.

The porous aluminum can also be used as a negative electrode material for molten salt batteries. When the porous aluminum is used as a negative electrode material, the active material may be sodium alone, an alloy of sodium and another metal, or carbon. Sodium has a melting point of approximately 98° C. and becomes softer with an increase in temperature. Thus, it is preferable to alloy sodium with another metal (such as Si, Sn, or In). In particular, an alloy of sodium and Sn is preferred because of its excellent handleability. Sodium or a sodium alloy can be supported on the surface of the porous aluminum by electroplating, hot dipping, or another method. Alternatively, a metal (such as Si) to be alloyed with sodium may be deposited on the porous aluminum by plating and converted into a sodium alloy by charging the molten salt battery.

FIG. 6 is a schematic cross-sectional view of a molten salt battery manufactured by using the battery electrode material described above. The molten salt battery includes a positive electrode 121, in which a positive electrode active material is supported on the surface of the aluminum skeleton of porous aluminum, a negative electrode 122, in which a negative electrode active material is supported on the surface of the aluminum skeleton of porous aluminum, and a separator 123 impregnated with a molten salt electrolyte, in a case 127. A pressing member 126 is disposed between the top surface of the case 127 and the negative electrode. The pressing member 126 includes a presser plate 124 and a spring 125 for pressing the presser plate. The pressing member 126 can uniformly press the positive electrode 121, the negative electrode 122, and the separator 123 into contact with one another even when the volumes of them have changed. A collector (porous aluminum) of the positive electrode 121 and a collector (porous aluminum) of the negative electrode 122 are connected to a positive electrode terminal 128 and a negative electrode terminal 129, respectively, through a lead wire 130.

The molten salt serving as an electrolyte may be an inorganic salt or an organic salt that can melt at the operating temperature. The cation of the molten salt may be one or more selected from alkaline metals, such as lithium (Li), sodium (Na), potassium (K), rubidium (Rb), and cesium (Cs), and alkaline earth metals, such as beryllium (Be), magnesium (Mg), calcium (Ca), strontium (Sr), and barium (Ba).

In order to decrease the melting point of the molten salt, it is preferable to use a mixture of at least two salts. For example, use of potassium bis(fluorosulfonyl)amide (KFSA) and sodium bis(fluorosulfonyl)amide (NaFSA) in combination can decrease the battery operating temperature to 90° C. or less.

The molten salt is used in the form of a separator impregnated with the molten salt. The separator prevents the contact between the positive electrode and the negative electrode and may be a glass nonwoven fabric or porous resin. A laminate of the positive electrode, the negative electrode, and the separator impregnated with the molten salt housed in a case is used as a battery.

(Electrical Double Layer Capacitor)

The porous aluminum can also be used as an electrode material for electrical double layer capacitors. When the porous aluminum is used as an electrode material for an electrical double layer capacitor, the electrode active material may be activated carbon. The activated carbon is used in combination with a conduction aid or a binder. The conduction aid may be graphite or carbon nano-tube. The binder may be polytetrafluoroethylene (PTFE) or styrene-butadiene rubber.

FIG. 7 is a schematic cross-sectional view of an electrical double layer capacitor manufactured by using the electrode material for an electrical double layer capacitor. A polarizable electrode 141 is disposed in an organic electrolyte 143 partitioned with a separator 142. The polarizable electrode 141 is made of an electrode material, which is an electrode active material supported on the porous aluminum. The electrode polarizable material 141 is connected to a lead wire 144. All the components are housed in a case 145. Use of the porous aluminum as a collector can increase the surface area of the collector. Thus, even a thin layer of activated carbon as the active material on the surface of the porous aluminum can result in an electrical double layer capacitor with a high power and a high capacity.

Although the resin expansion molded body is used as the resin molded body as described above, the present invention is not limited to the resin expansion molded body. A resin molded body having any shape can be used to manufacture an aluminum structural body having a desired shape.

Example

Manufacture of Porous Aluminum: Formation of Aluminum Layer by Vapor Deposition Method An example of the manufacture of porous aluminum will be specifically described below. A urethane foam having a thickness of 1.6 mm, a porosity of 95%, and approximately 50 pores (cells) per inch was prepared as a resin expansion molded body and was cut into a 140 mm×340 mm square. Vapor deposition of aluminum on the surface of the urethane foam was performed to form an electrically conductive layer having a thickness of approximately 1 µm.

(Deposition of Noble Metal)

The vapor deposition of gold was performed on a resin molded body having an electrically conductive layer to form a noble metal layer having a thickness of 0.005 µm. Gold was evaporated by a method for emitting an electron beam with an electron gun. An inert gas was introduced around the urethane having an electrically conductive layer at a pressure in the range of 0.01 to 1 Pa. Gold was melted with an electron beam and was deposited as a gold thin film on the surface of the electrically conductive layer.

(Molten Salt Plating)

The jig holding the urethane foam having the electrically conductive layer and the noble metal layer on the surface thereof was connected to the cathode of a rectifier, and an aluminum plate (purity 99.99%) of the counter electrode was connected to the anode. The jig can supply electricity through four sides of the urethane foam and allows plating in a 100 mm×300 mm area. The jig was dipped in a molten salt aluminum plating bath (67% by mole $AlCl_3$-33% by mole EMIC) at a temperature of 40° C. A direct current was applied to the jig at an electric current density of 3.6 $A/dm^2$ for 90 minutes to perform aluminum plating. Agitation was performed with a stirrer having a Teflon (registered trademark) rotor. These procedures were performed in an argon atmosphere at low humidity (a dew-point temperature of −30° C. or less) in a glove box. The electric current density was calculated on the basis of the apparent area of the porous aluminum (the actual surface area of the urethane foam was approximately eight times the apparent area). As a result, 180 $g/m^2$ of aluminum plating was almost uniformly formed.

(Manufacture of Porous Aluminum: Decomposition of Resin Expansion Molded Body)

The resin foam having the aluminum plated layer was dipped in a LiCl—KCl eutectic molten salt at a temperature of 500° C. A negative potential of −1 V was applied to the resin foam for 30 minutes. Air bubbles were generated in the molten salt, indicating the decomposition reaction of the polyurethane. The product was cooled to room temperature in the atmosphere and was washed with water to remove the molten salt, thus forming porous aluminum.

The porous aluminum was dissolved in nitromuriatic acid and was analyzed with an inductively-coupled plasma emission spectrometer. The carbon content was measured by an infrared absorption method after combustion in a high-frequency induction furnace in accordance with Japan Industrial Standard G1211. The aluminum purity was 99% by mass. The porous aluminum contained 0.5% by mass carbon and 0.03% by mass gold. The energy dispersive X-ray spectroscopy (EDX) of the surface at an accelerating voltage of 15 kV showed a negligible oxygen peak, indicating that the oxygen content of the porous aluminum was lower than the detection limit of EDX (3.1% by mass).

(Evaluation of Porous Aluminum in Battery)

The practical evaluation of porous aluminum used as a battery electrode will be described below in comparison with a conventional structure having an aluminum foil electrode.

A positive electrode active material $LiCoO_2$ having an average particle diameter of 7 μM, a conduction aid carbon black, and a binder resin polyvinylidene fluoride were mixed at 10:1:1 (mass ratio). A solvent N-methyl-2-pyrrolidone was added to the mixture to prepare a paste. Porous aluminum having a three-dimensional network structure and a porosity of approximately 95% was filled with the paste, was dried under vacuum at 150° C., and was role-pressed to a thickness corresponding to 70% of the initial thickness to form a battery electrode material (positive electrode). The battery electrode material was punched in a diameter of 10 mm and was fixed to a coin battery container made of stainless steel SUS304 by spot welding. The positive electrode capacity was 2.4 mAh.

For comparison purposes, the mixture paste of $LiCoO_2$, carbon black, and polyvinylidene fluoride was applied to aluminum foil having a thickness of 20 μm and was dried and role-pressed in the same manner as described above to prepare a battery electrode material (positive electrode). The battery electrode material was punched in a diameter of 10 mm and was fixed to a coin battery container made of stainless steel SUS304 by spot welding. The positive electrode capacity was 0.24 mAh.

A polypropylene porous film having a thickness of 25 μm was used as a separator. A solution of 1 M $LiPF_6$ in EC/DEC (volume ratio 1:1) was dropped at 0.1 ml/cm² on the separator, which was then subjected to vacuum impregnation. A lithium aluminum foil having a thickness of 20 μm and a diameter of 11 mm was fixed to the top lid of a coin battery container as a negative electrode. The battery electrode material (positive electrode), the separator, and the negative electrode were laminated in this order and were caulked with a Viton (registered trademark) o-ring placed between the top lid and the bottom lid to manufacture a battery. In charging and discharging, the upper limit voltage was 4.2 V, and the lower limit voltage was 3.0 V. Charging to the positive electrode capacity was followed by discharging at each discharge rate. The lithium secondary battery containing the porous aluminum as the positive electrode material had a capacity approximately five times the capacity of a conventional battery containing aluminum foil as the electrode material at 0.2 C. A life-cycle test was performed on the basis of the cycle life described in Japan Industrial Standard C 8711. In charge and discharge, the upper limit voltage was 4.2 V, and the lower limit voltage was 3.0 V. A cycle of charging to the positive electrode capacity and discharging at a discharge rate of 0.2 C was performed multiple times. The lithium secondary battery that included the porous aluminum as the positive electrode material exhibited no reduction in voltage or capacity and did not cause a problem in the cycling characteristics as compared with the battery containing aluminum foil as the electrode material.

The above description includes the following characteristics.

(Additional Entry 1)

A manufacturing method of an aluminum structural body, including: a electrical conduction treatment process of forming an electrically conductive layer on a surface of a resin molded body, the electrically conductive layer being made of one or more noble metals selected from the group consisting of gold, silver, platinum, rhodium, ruthenium, and palladium; and a plating process of plating the resin molded body subjected to the electrical conduction treatment process with aluminum in a first molten salt bath, wherein the method further includes a process of decomposing the resin molded body by heating the resin molded body to the melting point of aluminum or less while the resin molded body having the aluminum plated layer is dipped in a second molten salt and while a negative potential is applied to the aluminum plated layer.

(Additional Entry 2)

A manufacturing method of an aluminum structural body, including: a electrical conduction treatment process of forming an electrically conductive layer on a surface of a resin molded body, the electrically conductive layer being made of one or more metals selected from the group consisting of nickel, copper, cobalt, and iron; a plating process of plating the resin molded body subjected to the electrical conduction treatment process with aluminum in a molten salt bath; and a dissolution process of dissolving the electrically conductive layer after the plating process, wherein the method further includes a process of decomposing the resin molded body by heating the resin molded body to the melting point of aluminum or less while the resin molded body having the aluminum plated layer is dipped in a molten salt and while a negative potential is applied to the aluminum plated layer.

(Additional Entry 3)

A manufacturing method of an aluminum structural body, including: a electrical conduction treatment process of forming an electrically conductive layer made of aluminum on a surface of a resin molded body, a process of performing a conversion treatment method for zinc or zinc alloy plating to form a zinc film on a surface of the electrically conductive layer, and a plating process of plating the resin molded body having the zinc film with aluminum in a first molten salt bath, wherein while the resin molded body having the aluminum plated layer is dipped in a second molten salt and while a negative potential is applied to the aluminum plated layer, the resin molded body is heated to the melting point of aluminum or less to decompose the resin molded body.

(Additional Entry 4)

A manufacturing method of an aluminum structural body, including: a electrical conduction treatment process of forming an electrically conductive layer made of aluminum on a surface of a resin molded body, a process of depositing one or more noble metals selected from the group consisting of gold, silver, platinum, rhodium, ruthenium, and palladium on a surface of the electrically conductive layer, and a plating process of plating the resin molded body, on which the noble metal(s) is deposited, with aluminum in a first molten salt bath, wherein while the resin molded body having the aluminum plated layer is dipped in a second molten salt and while a negative potential is applied to the aluminum plated layer, the resin molded body is heated to the melting point of aluminum or less to decompose the resin molded body.

(Additional Entry 5)

The manufacturing method of porous aluminum according to any one of Additional Entries 1 to 4, wherein the resin molded body is a resin expansion molded body having contiguous pores.

(Additional Entry 6)

The manufacturing method of an aluminum structural body according to Additional Entry 2, wherein the molten salt bath used in the plating process is an electroplating bath which comprises an imidazolium salt.

(Additional Entry 7)

The manufacturing method of an aluminum structural body according to Additional Entry 2 or 6, wherein the molten salt bath is an electroplating bath which comprises an imidazolium salt and to which an organic solvent is added.

(Additional Entry 8)

The manufacturing method of an aluminum structural body according to Additional Entry 7, wherein the addition of the organic solvent accounts for 25% to 57% by mole of the entire plating liquid.

(Additional Entry 9)

The manufacturing method of an aluminum structural body according to Additional Entry 8, further including a washing process using the organic solvent as a cleaning liquid after the plating process.

(Additional Entry 10)

The manufacturing method of an aluminum structural body according to Additional Entry 3, wherein the process for performing a conversion treatment method for zinc or zinc alloy plating to form a zinc film is performed by dipping the resin molded body having the electrically conductive layer in a liquid for the conversion treatment method for zinc or zinc alloy plating at a temperature of 4° C. or more and 15° C. or less.

(Additional Entry 11)

The manufacturing method of an aluminum structural body according to Additional Entry 4, wherein the process of depositing noble metal(s) is performed by a gas phase method.

(Additional Entry 12)

An electrode material in which an active material is supported on an aluminum surface of an aluminum structural body according to the present invention.

(Additional Entry 13)

A battery containing the electrode material according to Additional Entry 12 in one or both of the positive electrode and the negative electrode.

(Additional Entry 14)

An electrical double layer capacitor containing the electrode material according to Additional Entry 12 as an electrode.

(Additional Entry 15)

A filtration filter including an aluminum structural body according to the present invention.

(Additional Entry 16)

A catalyst support in which a catalyst is supported on the surface of an aluminum structure structural body according to the present invention.

INDUSTRIAL APPLICABILITY

The present invention can provide a structure in which a surface of a resin molded body is plated with aluminum and an aluminum structural body manufactured by removing the resin molded body from the structure. Thus, the present invention can be widely applied as porous aluminum to cases where the characteristics of aluminum can be exploited, for example, in electric materials, such as battery electrodes, various filters for filtration, and catalyst supports.

REFERENCE SIGNS LIST

1 Resin expansion molded body
2 Electrically conductive layer
3 Aluminum plated layer
4 Cavity
21a, 21b Plating bath
22 Strip of resin
23, 28 Plating bath
24 Cylindrical electrode
25,27 Positive electrode
26 Electrode roller
121 Positive electrode
122 Negative electrode
123 Separator
124 Presser plate
125 Spring
126 Pressing member
127 Case
128 Positive terminal
129 Negative terminal
130 Lead wire
141 Polarizable electrode
142 Separator
143 Organic electrolyte
144 Lead wire
145 Case

The invention claimed is:

1. An aluminum structural body having a tubular skeleton structure, as metal layers, comprising a cavity in the skeleton structure with a triangular section, a first aluminum layer having a thickness in the range of 1 to 100 µm on an outside surface of the skeleton structure, a second aluminum layer having a thickness in the range of 0.05 to 1 µm on an inside surface of the skeleton structure, and a noble metal layer between the two aluminum layers.

* * * * *